US012562705B2

(12) United States Patent
Kido et al.

(10) Patent No.: US 12,562,705 B2
(45) Date of Patent: Feb. 24, 2026

(54) RADIO FREQUENCY MODULE INCLUDING CONTROL CIRCUIT POSITIONED BETWEEN SWITCHES AND COMMUNICATION DEVICE

(71) Applicant: Murata Manufacturing Co., Ltd., Nagaokakyo (JP)

(72) Inventors: Syunsuke Kido, Nagaokakyo (JP); Yukiteru Sugaya, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 476 days.

(21) Appl. No.: 18/124,634

(22) Filed: Mar. 22, 2023

(65) Prior Publication Data

US 2023/0318559 A1 Oct. 5, 2023

(30) Foreign Application Priority Data

Mar. 31, 2022 (JP) ................................. 2022-061330

(51) Int. Cl.
| *H05K 1/02* | (2006.01) |
| *H03H 7/01* | (2006.01) |
| *H03H 9/54* | (2006.01) |

(52) U.S. Cl.
CPC ............ *H03H 7/0115* (2013.01); *H03H 9/54* (2013.01); *H05K 1/0243* (2013.01); *H05K 2201/10053* (2013.01); *H05K 2201/1006* (2013.01)

(58) Field of Classification Search
None
See application file for complete search history.

(56) References Cited

U.S. PATENT DOCUMENTS

| 2020/0028493 A1* | 1/2020 | Ta ............................ H04B 1/40 |
| 2021/0075448 A1* | 3/2021 | Mori ....................... H03F 3/245 |
| 2021/0273670 A1* | 9/2021 | Yasuda ............... H04B 1/1615 |
| 2021/0367622 A1* | 11/2021 | Ikegami ................... H04B 1/40 |

FOREIGN PATENT DOCUMENTS

WO 2018/110393 A1 6/2018

OTHER PUBLICATIONS

Chinese Office Action issued Sep. 29, 2025, in corresponding Chinese Patent Application No. 202310209487.3, 24pp.

* cited by examiner

*Primary Examiner* — Idowu O Osifade
(74) *Attorney, Agent, or Firm* — XSENSUS LLP

(57) ABSTRACT

A radio frequency module includes a first switch, a second switch, a control circuit, a first filter, a second filter, a third filter, a fourth filter, and an antenna terminal. The first switch is capable of connecting a first selection terminal or a second selection terminal to a first common terminal in a selective manner. The second switch is capable of connecting a third selection terminal or a fourth selection terminal to a second common terminal in a selective manner. The first switch, the second switch, and the control circuit are provided in a single electronic component (a first electronic component). The control circuit is positioned between the first switch and the second switch in the electronic component.

20 Claims, 19 Drawing Sheets

RADIO FREQUENCY MODULE INCLUDING CONTROL CIRCUIT POSITIONED BETWEEN SWITCHES AND COMMUNICATION DEVICE

CROSS-REFERENCE TO RELATED APPLICATION

The present application claims priority to Japanese patent application JP 2022-061330, filed Mar. 31, 2022, the entire contents of which being incorporated herein by reference.

BACKGROUND OF THE INVENTION

1. Field of the Invention

The present invention relates generally to a radio frequency module and a communication device and more specifically to a radio frequency module including a plurality of switches and a plurality of filters, and a communication device including the radio frequency module.

2. Description of the Related Art

In International Publication No. WO2018/110393, a front end module is described that includes a substrate, a filter unit provided on the substrate, and a switch integrated circuit (IC) provided on the substrate. The filter unit has a plurality of filters. The switch IC has a plurality of switches.

SUMMARY OF THE INVENTION

In the front end module (a radio frequency module) described in International Publication No. WO2018/110393, depending on the positions of the plurality of switches (a first switch and a second switch) in the switch IC (an electronic component), the degree of isolation between the plurality of switches may be reduced.

An object of the present invention is to provide a radio frequency module and a communication device that can suppress a reduction in the degree of isolation between a first switch and a second switch provided in a single electronic component.

A radio frequency module according to an aspect of the present invention includes a first switch, a second switch, a control circuit, a first filter, a second filter, a third filter, a fourth filter, and an antenna terminal. The first switch has a first common terminal, a first selection terminal, and a second selection terminal. The second switch has a second common terminal, a third selection terminal, and a fourth selection terminal. The control circuit controls the first switch and the second switch. The first filter is connected to the first selection terminal of the first switch. The second filter is connected to the third selection terminal of the second switch. The third filter is connected to the second selection terminal of the first switch. The fourth filter is connected to the fourth selection terminal of the second switch. The antenna terminal is connected to the first filter, the second filter, the third filter, and the fourth filter. The first switch is capable of connecting the first selection terminal or the second selection terminal to the first common terminal in a selective manner. The second switch is capable of connecting the third selection terminal or the fourth selection terminal to the second common terminal in a selective manner. The first switch, the second switch, and the control circuit are provided in a single electronic component. The control circuit is positioned between the first switch and the second switch in the electronic component.

A communication device according to an aspect of the present invention includes the radio frequency module and a signal processing circuit. The signal processing circuit is connected to the radio frequency module.

With the radio frequency module and the communication device according to the aspects of the present invention, a reduction in the degree of isolation between the first switch and the second switch provided in the single electronic component can be suppressed.

DESCRIPTION OF THE PREFERRED EMBODIMENTS

Figure 1:
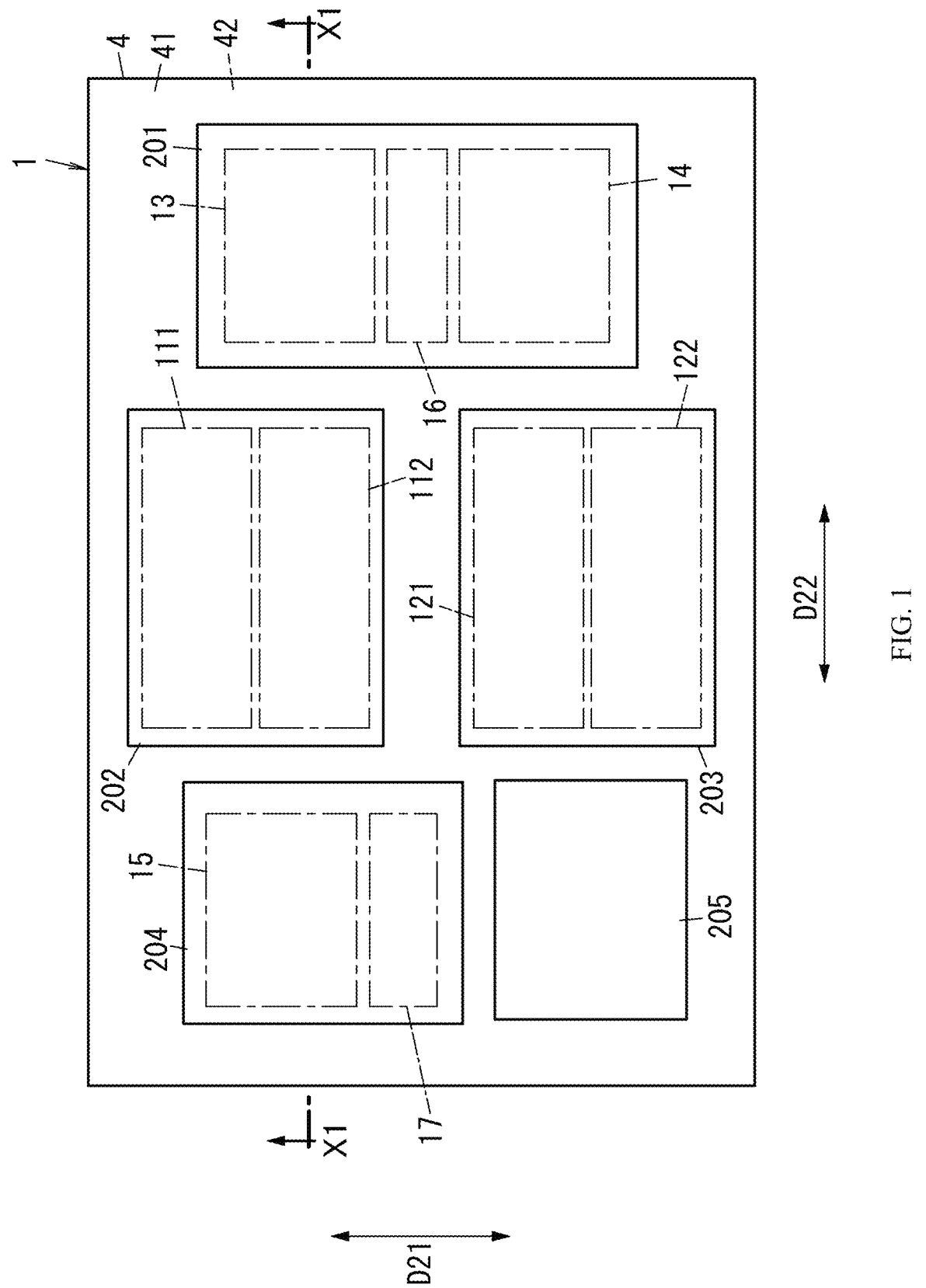
FIG. 1 is a plan view of a radio frequency module according to a first embodiment.

In the following, radio frequency modules and communication devices according to first to sixth embodiments will be described with reference to the drawings. FIGS. 1, 2, 4 to 6, 9, and 11 to 17 to which reference will be made in the following embodiments and so forth are schematic diagrams, and the ratios between the sizes and thicknesses of the individual structural elements in the drawings may not necessarily reflect the actual dimensional ratios.

First Embodiment

1. Radio Frequency Module

First, the configuration of a radio frequency module 1 according to the first embodiment will be described with reference to FIG. 3. In the following, the radio frequency module 1 may be referred to as a "first radio frequency module 1" in order to differentiate the radio frequency module 1 from a second radio frequency module 2 and a third radio frequency module 3 to be described later.

Figure 3:
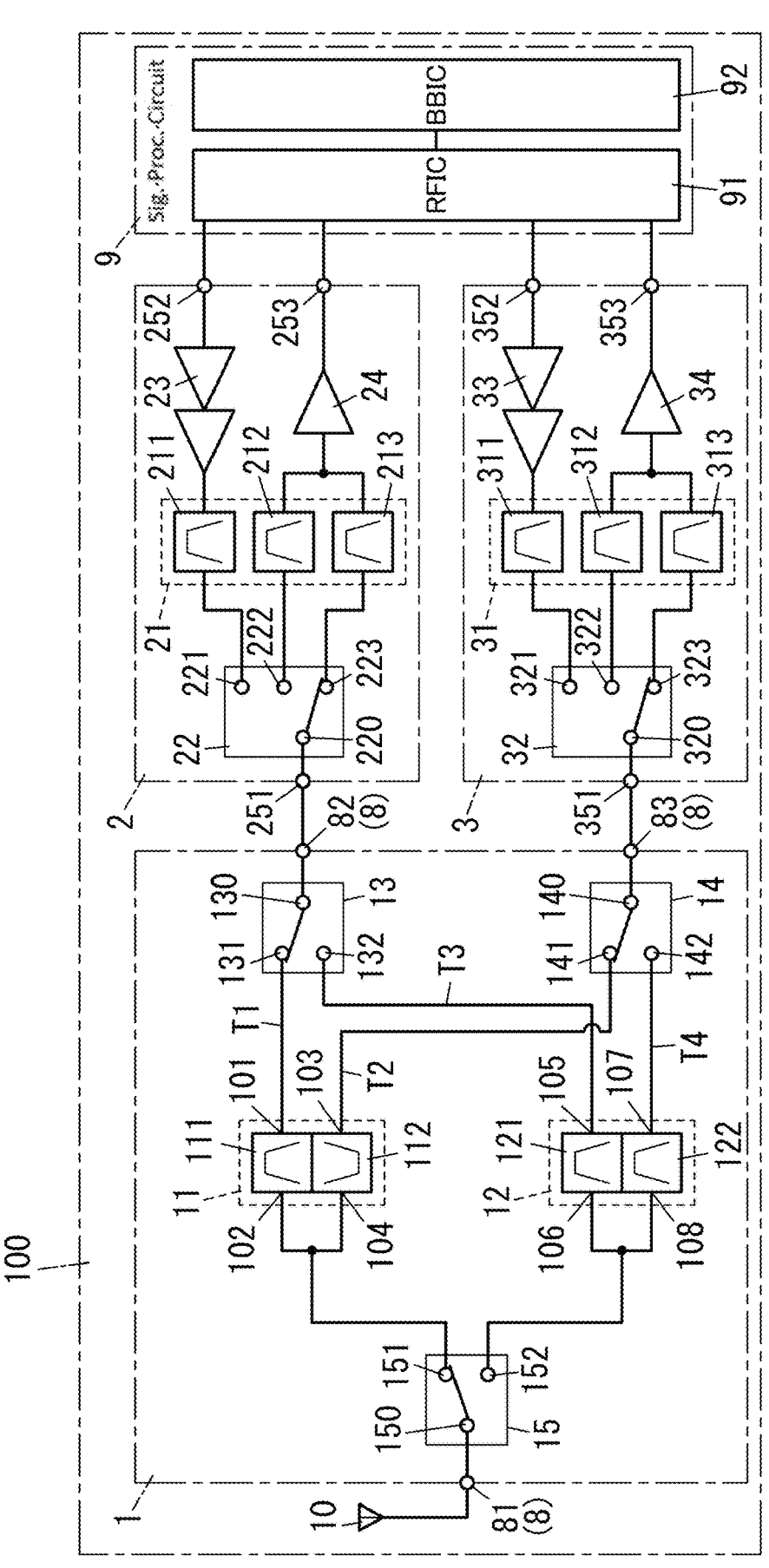
FIG. 3 is a circuit configuration diagram of a communication device including the radio frequency module according to the first embodiment.

The radio frequency module 1 is used in, for example, a communication device 100 as illustrated in FIG. 3. The communication device 100 is, for example, a cellular phone such as a smartphone. Note that the communication device 100 is not limited to a cellular phone and may be, for example, a wearable device such as a smartwatch or the like. The radio frequency module 1 is, for example, a module that can support the fourth generation mobile communication (4G) standard, the fifth generation mobile communication (5G) standard, the Wi_Fi® standard, the Bluetooth® standard, and so forth. The 4G standard is, for example, the third generation partnership project (3GPP) long term evolution (LTE) standard. The 5G standard is, for example, 5G New Radio (NR). The radio frequency module 1 is, for example, a module that can support carrier aggregation and dual connectivity. Carrier aggregation and dual connectivity are techniques used in communication in which radio waves in a plurality of frequency bands are simultaneously used.

The communication device 100 performs communication in a plurality of communication bands. In more detail, the communication device 100 transmits transmission signals of the plurality of communication bands and receives reception signals of the plurality of communication bands.

Some of the transmission signals and reception signals of the plurality of communication bands are frequency division duplex (FDD) signals. FDD is a wireless communication technique for assigning different frequency bands to transmission and reception in wireless communication and performing transmission and reception. Note that transmission signals and reception signals of the plurality of communication bands are not limited to FDD signals and may also be time division duplex (TDD) signals. TDD is a wireless communication technique for assigning the same frequency bands to transmission and reception in wireless communication and switching between transmission and reception on a time basis to perform transmission and reception.

2. Circuit Configuration of Radio Frequency Module

Next, a circuit configuration of the radio frequency module 1 according to the first embodiment will be described with reference to FIGS. 3 and 4.

The radio frequency module 1 according to the first embodiment includes, as illustrated in FIG. 3, a plurality of multiplexers 11 and 12 (two multiplexers in the illustrated example), a first switch 13, a second switch 14, and a third switch 15. The radio frequency module 1 according to the first embodiment further includes a plurality of control circuits 16 and 17 (two control circuits in the illustrated example) (see FIG. 1). The radio frequency module 1 according to the first embodiment further includes a plurality of external connection terminals 8 (three external connection terminals in the illustrated example).

2.1. Multiplexers

The multiplexer 11 includes, as illustrated in FIG. 3, a first filter 111 and a second filter 112. The first filter 111 is, for example, a transmission-reception filter that allows transmission signals and reception signals of a first communication band to pass therethrough. That is, the first filter 111 is a band pass filter whose pass band includes the first communication band. The second filter 112 is, for example, a transmission-reception filter that attenuates (blocks) transmission signals and reception signals of the first communication band. That is, the second filter 112 is a band elimination filter including the first communication band as a stopband. Thus, the second filter 112 enables transmission signals and reception signals of at least a second communication band to pass therethrough. The second communication band is a different communication band from the first communication band.

The first filter 111 is provided on a first signal path T1. The first signal path T1 connects an antenna terminal 81 and a first signal terminal 82 to each other, which will be described later. In more detail, the first filter 111 is provided between a selection terminal 131 of the first switch 13 and a selection terminal 151 of the third switch 15 on the first signal path T1. The first filter 111 has a first input-output terminal 101 and a second input-output terminal 102. The first input-output terminal 101 of the first filter 111 is connected to the selection terminal 131 of the first switch 13. The second input-output terminal 102 of the first filter 111 is connected to the selection terminal 151 of the third switch 15. The first filter 111 allows, among radio frequency signals amplified by a power amplifier 23 of the second radio frequency module 2 to be described later, transmission signals of the transmission band of the first communication band to pass therethrough. The first filter 111 allows, among radio frequency signals input from the antenna terminal 81, reception signals of the reception band of the first communication band to pass therethrough.

The second filter 112 is provided on a second signal path T2. The second signal path T2 connects the antenna terminal 81 and a second signal terminal 83 to each other, which will be described later. In more detail, the second filter 112 is provided on the second signal path T2 between a selection terminal 141 of the second switch 14 and the selection terminal 151 of the third switch 15. The second filter 112 has a first input-output terminal 103 and a second input-output terminal 104. The first input-output terminal 103 of the second filter 112 is connected to the selection terminal 141 of the second switch 14. The second input-output terminal 104 of the second filter 112 is connected to the selection terminal 151 of the third switch 15. The second filter 112 attenuates, among radio frequency signals amplified by a power amplifier 33 of the third radio frequency module 3 to be described later, transmission signals of the transmission band of the first communication band and allows transmission signals of the transmission band of the second communication band to pass therethrough. The second filter 112 attenuates, among radio frequency signals input from the antenna terminal 81, reception signal of the reception band of the first communication band and allows reception signals of the reception band of the second communication band to pass therethrough.

The multiplexer 12 includes, as illustrated in FIG. 3, a third filter 121 and a fourth filter 122. The third filter 121 is, for example, a transmission-reception filter that allows transmission signals and reception signals of a third communication band to pass therethrough. That is, the third filter 121 is a band pass filter whose pass band includes the third communication band. The fourth filter 122 is, for example, a transmission-reception filter that allows transmission signals and reception signals of a fourth communication band to pass therethrough. That is, the fourth filter 122 is a band pass filter whose pass band includes the fourth communication band.

The third filter 121 is provided on a third signal path T3, which connects the antenna terminal 81 and the first signal terminal 82 to each other. In more detail, the third filter 121 is provided on the third signal path T3 between a selection terminal 132 of the first switch 13 and a selection terminal 152 of the third switch 15. The third filter 121 has a first input-output terminal 105 and a second input-output terminal 106. The first input-output terminal 105 of the third filter 121 is connected to the selection terminal 132 of the first switch 13. The second input-output terminal 106 of the third filter 121 is connected to the selection terminal 152 of the third switch 15. The third filter 121 allows, among radio frequency signals amplified by the power amplifier 23 of the second radio frequency module 2, transmission signals of the transmission band of the third communication band to pass therethrough. The third filter 121 allows, among radio frequency signals input from the antenna terminal 81, reception signals of the reception band of the third communication band to pass therethrough.

The fourth filter 122 is provided on a fourth signal path T4, which connects the antenna terminal 81 and the second signal terminal 83 to each other. In more detail, the fourth filter 122 is provided on the fourth signal path T4 between a selection terminal 142 of the second switch 14 and the selection terminal 152 of the third switch 15. The fourth filter 122 has a first input-output terminal 107 and a second input-output terminal 108. The first input-output terminal 107 of the fourth filter 122 is connected to the selection terminal 142 of the second switch 14. The second input-output terminal 108 of the fourth filter 122 is connected to the selection terminal 152 of the third switch 15. The fourth filter 122 allows, among radio frequency signals amplified by the power amplifier 33 of the third radio frequency module 3, transmission signals of the transmission band of the fourth communication band to pass therethrough. The fourth filter 122 allows, among radio frequency signals input from the antenna terminal 81, reception signals of the reception band of the fourth communication band to pass therethrough.

In this case, in the present embodiment, part of the pass band of the first filter 111 and part of the pass band of the third filter 121 overlap each other. Note that the entire pass band of the first filter 111 and part of the pass band of the third filter 121 may overlap each other, part of the pass band of the first filter 111 and the entire pass band of the third filter 121 may overlap each other, or the entire pass band of the first filter 111 and the entire pass band of the third filter 121 may overlap each other. In short, "the pass band of the first filter 111 and the pass band of the third filter 121 overlap each other" refers to at least part of the pass band of the first filter 111 and at least part of the pass band of the third filter 121 overlapping each other.

In the present embodiment, the entire pass band of the first filter 111 and the entire stopband of the second filter 112 overlap each other. Note that the entire pass band of the first filter 111 and part of the stopband of the second filter 112 may overlap each other, part of the pass band of the first filter 111 and the entire stopband of the second filter 112 may overlap each other, or part of the pass band of the first filter 111 and part of the stopband of the second filter 112 may overlap each other. In short, "the pass band of the first filter 111 and the stopband of the second filter 112 overlap each other" refers to at least part of the pass band of the first filter 111 and at least part of the stopband of the second filter 112 overlapping each other.

2.2. First Switch

The first switch 13 switches, between the first filter 111 and the third filter 121, a filter connected to the second radio frequency module 2 to be described later. That is, the first switch 13 is a switch for switching a path connected to the second radio frequency module 2 (between the first signal path T1 and the third signal path T3). The first switch 13 has a common terminal 130 and the plurality of selection terminals 131 and 132 (two selection terminals in the illustrated example). The common terminal 130 is connected to the first signal terminal 82. The selection terminal 131 is connected to the first filter 111. The selection terminal 132 is connected to the third filter 121.

The first switch 13 switches the connection state between the common terminal 130 and the plurality of selection terminals 131 and 132. The first switch 13 is controlled by, for example, the control circuit 16 (see FIG. 1) to be described later. The first switch 13 electrically connects, in accordance with a control signal from the control circuit 16, the common terminal 130 and at least one of the selection terminals 131 and 132 to each other. In this case, in the present embodiment, the common terminal 130 is a first common terminal, the selection terminal 131 is a first selection terminal, and the selection terminal 132 is a second selection terminal.

2.3. Second Switch

The second switch 14 switches, between the second filter 112 and the fourth filter 122, a filter connected to the third radio frequency module 3 to be described later. That is, the second switch 14 is a switch for switching a path connected to the third radio frequency module 3 (between the second signal path T2 and the fourth signal path T4). The second switch 14 has a common terminal 140 and the plurality of selection terminals 141 and 142 (two selection terminals in the illustrated example). The common terminal 140 is connected to the second signal terminal 83. The selection terminal 141 is connected to the second filter 112. The selection terminal 142 is connected to the fourth filter 122.

The second switch 14 switches the connection state between the common terminal 140 and the plurality of selection terminals 141 and 142. The second switch 14 is controlled by, for example, the control circuit 16 (see FIG. 1) to be described later. The second switch 14 electrically connects, in accordance with a control signal from the control circuit 16, the common terminal 140 and at least one of the plurality of selection terminals 141 and 142 to each other. In this case, in the present embodiment, the common terminal 140 is a second common terminal, the selection terminal 141 is a third selection terminal, and the selection terminal 142 is a fourth selection terminal.

2.4. Third Switch

The third switch 15 switches a filter connected to the antenna terminal 81 among a plurality of filters (the first filter 111, the second filter 112, the third filter 121, and the fourth filter 122). That is, the third switch 15 is a switch for switching a path connected to an antenna 10 to be described later (among the first to fourth signal paths T1 to T4). The third switch 15 has a common terminal 150 and the plurality of selection terminals 151 and 152 (two selection terminals in the illustrated example). The common terminal 150 is connected to the antenna terminal 81. The selection terminal 151 is connected to the multiplexer 11 (the first filter 111 and the second filter 112). The selection terminal 152 is connected to the multiplexer 12 (the third filter 121 and the fourth filter 122).

The third switch 15 switches the connection state between the common terminal 150 and the plurality of selection terminals 151 and 152. The third switch 15 is controlled by, for example, the control circuit 17 (see FIG. 1) to be described later. The third switch 15 electrically connects, in accordance with a control signal from the control circuit 17, the common terminal 150 and at least one of the plurality of selection terminals 151 and 152 to each other.

2.5. Control Circuits

The control circuit 16 controls the first switch 13 and the second switch 14. The control circuit 16 has, as illustrated in FIG. 4, a plurality of ground terminals 161 (three ground terminals in the illustrated example) and a plurality of control terminals 162 (two control terminals in the illustrated example). The plurality of ground terminals 161 are arranged so as to be spaced equally along a second direction D22 to be described later. The plurality of control terminals 162 are arranged so as to be spaced equally along the second direction D22. The control circuit 16 outputs a control signal for controlling the first switch 13 from one of the control terminals 162. The control circuit 16 outputs a control signal for controlling the second switch 14 from the other one of the control terminals 162.

The control circuit 17 controls the third switch 15. The control circuit 17 has, as illustrated in FIG. 4, a plurality of ground terminals 171 (three ground terminals in the illustrated example) and a plurality of control terminals 172 (two control terminals in the illustrated example). The plurality of ground terminals 171 are arranged so as to be spaced equally along the second direction D22. The plurality of control terminals 172 are arranged so as to be spaced equally along the second direction D22. The control circuit 17 outputs a control signal for controlling the third switch 15 from one of the control terminals 172.

2.6. External Connection Terminals

The plurality of external connection terminals 8 are, as illustrated in FIG. 3, terminals for electrical connection to external circuits (for example, the second radio frequency module 2 and the third radio frequency module 3). The plurality of external connection terminals 8 include the antenna terminal 81, the first signal terminal 82, the second signal terminal 83, and a plurality of ground terminals (not illustrated).

The antenna terminal 81 is connected to the antenna 10. In the radio frequency module 1, the antenna terminal 81 is connected to the common terminal 150 of the third switch 15. The antenna terminal 81 is connected to the first filter 111, the second filter 112, the third filter 121, and the fourth filter 122 with the third switch 15 interposed therebetween.

The first signal terminal 82 is a terminal for inputting transmission signals from an external circuit (for example, the second radio frequency module 2) to the first radio frequency module 1. Moreover, the first signal terminal 82 is a terminal for outputting reception signals input to the first radio frequency module 1 through the antenna terminal 81 to the external circuit (for example, the second radio frequency module 2). In the radio frequency module 1, the first signal terminal 82 is connected to the common terminal 130 of the first switch 13. The first signal terminal 82 is connected to the first filter 111 and the third filter 121 with the first switch 13 interposed therebetween.

The second signal terminal 83 is a terminal for inputting transmission signals from an external circuit (for example, the third radio frequency module 3) to the first radio frequency module 1. Moreover, the second signal terminal 83 is a terminal for outputting reception signals input to the first radio frequency module 1 through the antenna terminal 81 to the external circuit (for example, the third radio frequency module 3). In the radio frequency module 1, the second signal terminal 83 is connected to the common terminal 140 of the second switch 14. The second signal terminal 83 is connected to the second filter 112 and the fourth filter 122 with the second switch 14 interposed therebetween.

The plurality of ground terminals are terminals that are electrically connected to a ground electrode of an external substrate (not illustrated) of the communication device 100 and to which a ground potential is applied. In the radio frequency module 1, the plurality of ground terminals are connected to a ground layer (not illustrated) of a mounting substrate 4. The ground layer is a circuit ground of the radio frequency module 1.

3. Structure of Radio Frequency Module

Next, the structure of the radio frequency module 1 according to the first embodiment will be described with reference to FIGS. 1 and 2.

Figure 2:
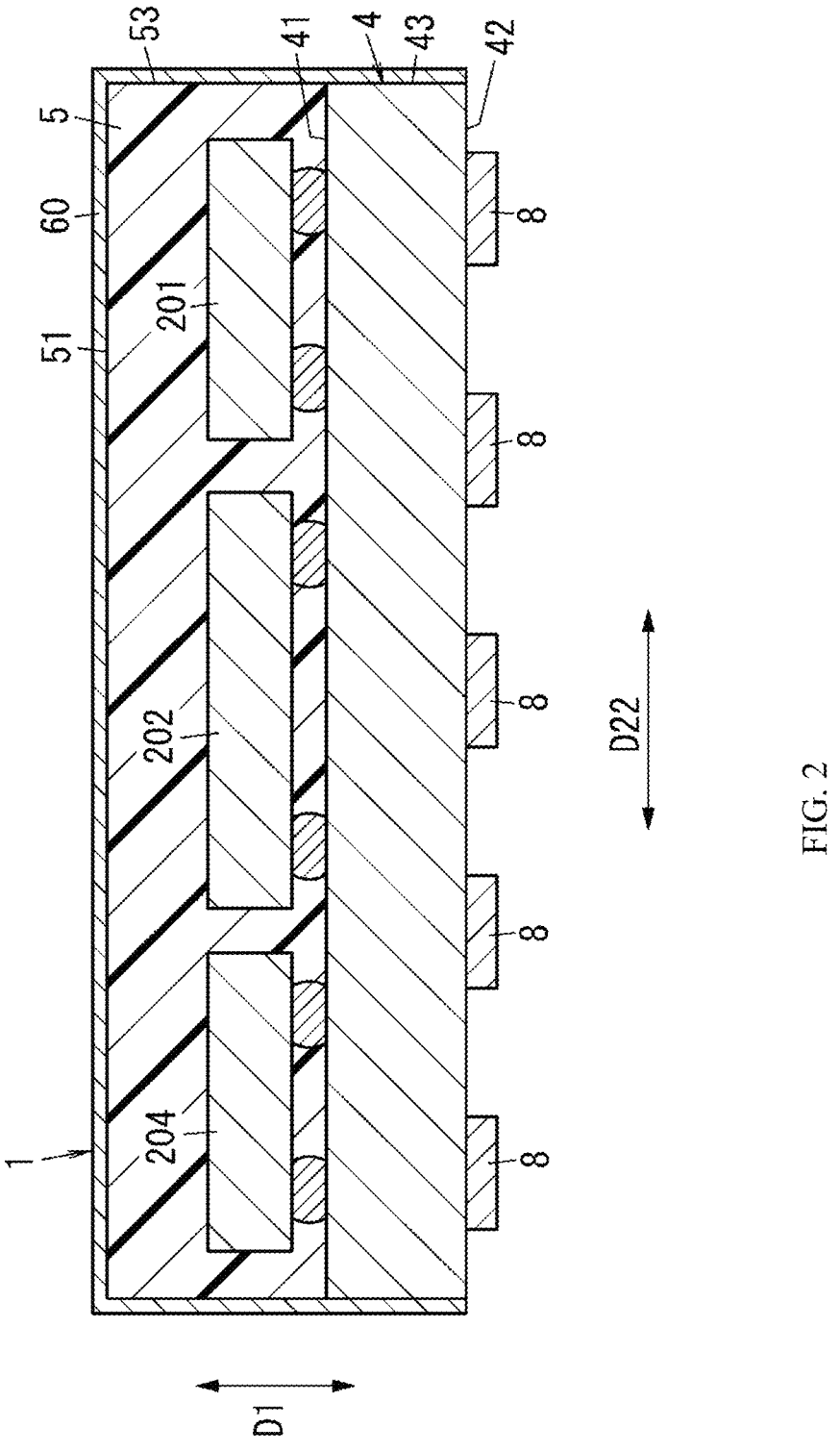
FIG. 2 is a cross-sectional view of the radio frequency module according to the first embodiment, the view being taken along line X1-X1 illustrated in FIG. 1.

As illustrated in FIGS. 1 and 2, the radio frequency module 1 includes the mounting substrate 4, a first electronic component 201, a second electronic component 202, a third electronic component 203, a fourth electronic component 204, a fifth electronic component 205, and the plurality of external connection terminals 8 (five external connection terminals in the illustrated example). The radio frequency module 1 further includes a resin layer 5 and a metal electrode layer 60.

The radio frequency module 1 can be electrically connected to an external substrate (not illustrated). The external substrate corresponds to, for example, a mother substrate of the communication device 100 (see FIG. 3) such as a cellular phone, a communication device, and the like. Note that "the radio frequency module 1 can be electrically connected to an external substrate" refers to not only a case where the radio frequency module 1 is directly mounted on the external substrate but also a case where the radio frequency module 1 is indirectly mounted on the external substrate. Moreover, "the radio frequency module 1 is indirectly mounted on the external substrate" refers to, for example, a case where the radio frequency module 1 is mounted on another radio frequency module mounted on the external substrate.

3.1. Mounting Substrate

The mounting substrate 4 has, as illustrated in FIG. 2, a first main surface 41 and a second main surface 42. The first main surface 41 and the second main surface 42 face each other in a thickness direction D1 of the mounting substrate 4. When the radio frequency module 1 is provided on an external substrate, the second main surface 42 faces a main surface, which is on the mounting substrate 4 side, of the external substrate. The mounting substrate 4 further has an outer peripheral surface 43 as illustrated in FIG. 2. The outer peripheral surface 43 includes four side surfaces of the mounting substrate 4 that connect the first main surface 41 and the second main surface 42 to each other.

The mounting substrate 4 is a multilayer substrate formed by laminating a plurality of dielectric layers. The mounting substrate 4 has a plurality of conductive layers and a plurality of via conductors (including a through electrode). The plurality of conductive layers include the ground layer having a ground potential. The plurality of via conductors are used to electrically connect elements (including the first to fifth electronic components 201 to 205 to be described later) mounted on the first main surface 41 to the conductive layers of the mounting substrate 4. The plurality of via conductors are also used to electrically connect the conductive layers of the mounting substrate 4 to the plurality of external connection terminals 8.

The first to fifth electronic components 201 to 205 are arranged on the first main surface 41 of the mounting substrate 4. The plurality of external connection terminals 8 are arranged on the second main surface 42 of the mounting substrate 4. That is, in the present embodiment, the first main surface 41 of the mounting substrate 4 is the main surface of the mounting substrate.

3.2. First Electronic Component

The first electronic component 201 is arranged on the first main surface 41 of the mounting substrate 4 as illustrated in FIGS. 1 and 2. In the example illustrated in FIG. 2, the first electronic component 201 is mounted on the first main surface 41 of the mounting substrate 4. Note that, regarding the first electronic component 201, part of the first electronic component 201 may be mounted on the first main surface 41 of the mounting substrate 4, and the rest of the first electronic component 201 may be mounted inside the mounting substrate 4. In short, the first electronic component 201 is located closer to the first main surface 41 than to the second main surface 42 in the mounting substrate 4, and at least a portion of the first electronic component 201 is mounted on the first main surface 41. The first electronic component 201 is an integrated circuit (IC) chip including the first switch 13, the second switch 14, and the control circuit 16 as illustrated in FIG. 1.

3.3. Second Electronic Component

The second electronic component 202 is arranged on the first main surface 41 of the mounting substrate 4 as illustrated in FIGS. 1 and 2. In the example illustrated in FIG. 2, the second electronic component 202 is mounted on the first main surface 41 of the mounting substrate 4. Note that, regarding the second electronic component 202, part of the second electronic component 202 may be mounted on the first main surface 41 of the mounting substrate 4, and the rest of the second electronic component 202 may be mounted inside the mounting substrate 4. In short, the second electronic component 202 is located closer to the first main surface 41 than to the second main surface 42 in the mounting substrate 4, and at least a portion of the second electronic component 202 is mounted on the first main surface 41. The second electronic component 202 includes, as illustrated in FIG. 1, the first filter 111 and the second filter 112.

Each of the first filter 111 and the second filter 112 is, for example, an acoustic wave filter including a plurality of series arm resonators and a plurality of parallel arm resonators. An acoustic wave filter is, for example, a surface acoustic wave (SAW) filter using a surface acoustic wave. Furthermore, each of the first filter 111 and the second filter 112 may include at least one of an inductor and a capacitor that are connected in series with any one of the plurality of series arm resonators or may include an inductor or a capacitor that is connected in series with any one of the plurality of parallel arm resonators.

3.4. Third Electronic Component

The third electronic component 203 is arranged on the first main surface 41 of the mounting substrate 4 as illustrated in FIGS. 1 and 2. In the example illustrated in FIG. 2, the third electronic component 203 is mounted on the first main surface 41 of the mounting substrate 4. Note that, regarding the third electronic component 203, part of the third electronic component 203 may be mounted on the first main surface 41 of the mounting substrate 4, and the rest of the third electronic component 203 may be mounted inside the mounting substrate 4. In short, the third electronic component 203 is located closer to the first main surface 41 than to the second main surface 42 in the mounting substrate 4, and at least a portion of the third electronic component 203 is mounted on the first main surface 41. The third electronic component 203 includes, as illustrated in FIG. 1, the third filter 121 and the fourth filter 122.

Each of the third filter 121 and the fourth filter 122 is, for example, an acoustic wave filter including a plurality of series arm resonators and a plurality of parallel arm resonators. An acoustic wave filter is, for example, a SAW filter using a surface acoustic wave. Furthermore, each of the third filter 121 and the fourth filter 122 may include at least one of an inductor and a capacitor that are connected in series with any one of the plurality of series arm resonators or may include an inductor or a capacitor that is connected in series with any one of the plurality of parallel arm resonators.

3.5. Fourth Electronic Component

The fourth electronic component 204 is arranged on the first main surface 41 of the mounting substrate 4 as illustrated in FIGS. 1 and 2. In the example illustrated in FIG. 2, the fourth electronic component 204 is mounted on the first main surface 41 of the mounting substrate 4. Note that, regarding the fourth electronic component 204, part of the fourth electronic component 204 may be mounted on the first main surface 41 of the mounting substrate 4, and the rest of the fourth electronic component 204 may be mounted inside the mounting substrate 4. In short, the fourth electronic component 204 is located closer to the first main surface 41 than to the second main surface 42 in the mounting substrate 4, and at least a portion of the fourth electronic component 204 is mounted on the first main surface 41. The fourth electronic component 204 is an IC chip including the third switch 15 and the control circuit 17 as illustrated in FIG. 1.

3.6. Fifth Electronic Component

The fifth electronic component 205 is arranged on the first main surface 41 of the mounting substrate 4 as illustrated in FIG. 1. The fifth electronic component 205 is mounted on the first main surface 41 of the mounting substrate 4. Note that, regarding the fifth electronic component 205, part of the fifth electronic component 205 may be mounted on the first main surface 41 of the mounting substrate 4, and the rest of the fifth electronic component 205 may be mounted inside the mounting substrate 4. In short, the fifth electronic component 205 is located closer to the first main surface 41 than to the second main surface 42 in the mounting substrate 4, and at least a portion of the fifth electronic component 205 is mounted on the first main surface 41. The fifth electronic component 205 is, for example, an inductor included in a matching circuit (not illustrated) provided on the path between the multiplexer 11 and the antenna terminal 81. The matching circuit is a circuit for achieving impedance matching between the antenna terminal 81 and the multiplexer 11. The inductor is, for example, a chip inductor.

3.7. External Connection Terminals

The plurality of external connection terminals 8 are terminals for electrically connecting the mounting substrate 4 and the external substrate (not illustrated) to each other.

The plurality of external connection terminals 8 are arranged on the second main surface 42 of the mounting substrate 4 as illustrated in FIG. 2. "The external connection terminals 8 are arranged on the second main surface 42 of the mounting substrate 4" includes the external connection terminals 8 being mechanically connected to the second main surface 42 of the mounting substrate 4 and the external connection terminals 8 being electrically connected to (appropriate conductor portions of) the mounting substrate 4. A material of the plurality of external connection terminals 8 is, for example, metal (for example, copper, a copper alloy, or the like), and a nickel plating film or a gold plating film, for example, is formed on the surfaces of the plurality of external connection terminals 8. In a plan view from the thickness direction D1 of the mounting substrate 4, each of the plurality of external connection terminals 8 has a rectangular shape.

3.8. Resin Layer

The resin layer 5 is arranged on the first main surface 41 of the mounting substrate 4 as illustrated in FIG. 2. The resin layer 5 covers the first to fifth electronic components 201 to 205. In more detail, the resin layer 5 covers the outer peripheral surfaces and main surfaces of the individual first to fifth electronic components 201 to 205, the main surfaces being on the opposite side from the mounting substrate 4 side. Regarding the first electronic component 201, the outer peripheral surface of the first electronic component 201 includes four side surfaces that connect the main surface on the mounting substrate 4 side and the main surface on the opposite side from the mounting substrate 4 side to each other. The same applies to the outer peripheral surfaces of the individual second to fifth electronic components 202 to 205. The resin layer 5 contains a resin (for example, epoxy resin). The resin layer 5 may contain a filler in addition to the resin.

3.9. Metal Electrode Layer

The metal electrode layer (a shield layer) 60 covers the resin layer 5 as illustrated in FIG. 2. The metal electrode layer 60 has conductivity. In the radio frequency module 1, the metal electrode layer 60 is a shield layer provided as an electromagnetic shield between the inside and the outside of the radio frequency module 1. The metal electrode layer 60 has a multilayer structure obtained by laminating a plurality of metal layers; however, the metal electrode layer 60 does not have to have a multilayer structure and may have a single metal layer. The single metal layer includes one or more kinds of metal. The metal electrode layer 60 covers a main surface 51 of the resin layer 5, an outer peripheral surface 53 of the resin layer 5, and the outer peripheral surface 43 of the mounting substrate 4, the main surface 51 being on the opposite side from the mounting substrate 4 side. The metal electrode layer 60 is in contact with at least part of the outer peripheral surface of the ground layer (not illustrated) of the mounting substrate 4. This enables the electric potential of the metal electrode layer 60 to be equal to that of the ground layer.

4. Detailed Structure of Each Structural Element of Radio Frequency Module

Next, a detailed structure of each structural element of the radio frequency module 1 according to the first embodiment will be described with reference to FIGS. 1 and 2.

4.1. Mounting Substrate

The mounting substrate 4 is, for example, the multilayer substrate including the plurality of dielectric layers (not illustrated) and the plurality of conductive layers (not illustrated). The plurality of dielectric layers and the plurality of conductive layers are stacked in the thickness direction D1 of the mounting substrate 4. The plurality of conductive layers are formed so as to have predetermined patterns determined on a layer basis. Each of the plurality of conductive layers includes one or more conductor portions in a single plane perpendicular to the thickness direction D1 of the mounting substrate 4. The material of each conductive layer is, for example, copper. The plurality of conductive layers includes the ground layer. In the radio frequency module 1, the plurality of ground terminals and the ground layer are electrically connected to each other with, for example, the via conductors of the mounting substrate 4 interposed therebetween. The mounting substrate 4 is, for example, a low temperature co-fired ceramics (LTCC) substrate. The mounting substrate 4 is not limited to a LTCC substrate and may also be, for example, a printed wiring board, a high temperature co-fired ceramics (HTCC) substrate, or a resin multilayer substrate.

Moreover, the mounting substrate 4 is not limited to a LTCC substrate and may also be, for example, a wiring structure. The wiring structure is, for example, a multilayer structure. The multilayer structure includes at least one insulating layer and at least one conductive layer. The at least one insulating layer is formed so as to have a predetermined pattern. In a case where there are a plurality of insulating layers, the plurality of insulating layers are formed so as to have predetermined patterns determined on a layer basis. The at least one conductive layer is formed so as to have a predetermined pattern that is different from the predetermined patterns of the insulating layers. In a case where there are a plurality of conductive layers, the plurality of conductive layers are formed so as to have predetermined patterns determined on a layer basis. The conductive layers may include one or more rewiring portions. In the wiring structure, in the thickness direction of the multilayer structure, a first surface among two surfaces that face each other is the first main surface 41 of the mounting substrate 4, and a second surface among the two surfaces is the second main surface 42 of the mounting substrate 4. The wiring structure may be, for example, an interposer. The interposer may be an interposer using a silicon substrate or may be a multilayer substrate.

The first main surface 41 and the second main surface 42 of the mounting substrate 4 are spaced apart from each other in the thickness direction D1 of the mounting substrate 4 and intersect the thickness direction D1 of the mounting substrate 4. The first main surface 41 of the mounting substrate 4 is, for example, perpendicular to the thickness direction D1 of the mounting substrate 4; however, for example, the first main surface 41 may include a side surface or the like of a conductor portion as a surface that is not perpendicular to the thickness direction D1 of the mounting substrate 4. The second main surface 42 of the mounting substrate 4 is, for example, perpendicular to the thickness direction D1 of the mounting substrate 4; however, for example, the second main surface 42 may include a side surface or the like of a conductor portion as a surface that is not perpendicular to the thickness direction D1 of the mounting substrate 4. Microbumps and microhollows may be formed, or microhollows or microbumps, may be formed on the first main surface 41 and the second main surface 42 of the mounting substrate 4. In a plan view from the thickness direction D1 of the mounting substrate 4, the mounting substrate 4 has a rectangular shape; however, the mounting substrate 4 may have, for example, a square shape.

4.2. First Electronic Component

As described above, the first electronic component 201 is an IC chip including the first switch 13, the second switch 14, and the control circuit 16. The IC chip constituting the first electronic component 201 is, for example, a Si IC chip. In a plan view from the thickness direction D1 of the mounting substrate 4, the outer edge of the first electronic component 201 has a rectangular shape. The first electronic component 201 is flip-chip mounted on the first main surface 41 of the mounting substrate 4.

4.3. Second Electronic Component

As described above, the second electronic component 202 includes the first filter 111 and the second filter 112. In a plan view from the thickness direction D1 of the mounting substrate 4, the outer edge of the second electronic component 202 has a rectangular shape. The second electronic component 202 is flip-chip mounted on the first main surface 41 of the mounting substrate 4.

4.4. Third Electronic Component

As described above, the third electronic component 203 includes the third filter 121 and the fourth filter 122. In a plan view from the thickness direction D1 of the mounting substrate 4, the outer edge of the third electronic component 203 has a rectangular shape. The third electronic component 203 is flip-chip mounted on the first main surface 41 of the mounting substrate 4.

4.5. Fourth Electronic Component

As described above, the fourth electronic component 204 is an IC chip including the third switch 15 and the control circuit 17. The IC chip constituting the fourth electronic component 204 is, for example, a Si IC chip. In a plan view from the thickness direction D1 of the mounting substrate 4, the outer edge of the fourth electronic component 204 has a rectangular shape. The fourth electronic component 204 is flip-chip mounted on the first main surface 41 of the mounting substrate 4.

4.6. Fifth Electronic Component

The fifth electronic component 205 is a chip inductor included in the above-described matching circuit. In a plan view from the thickness direction D1 of the mounting substrate 4, the outer edge of the fifth electronic component 205 has a rectangular shape. The fifth electronic component 205 is mounted, for example, on the first main surface 41 of the mounting substrate 4.

5. Communication Device

Next, a circuit configuration of the communication device 100 according to the first embodiment will be described with reference to FIG. 3.

The communication device 100 according to the first embodiment includes, as illustrated in FIG. 3, the first to third radio frequency modules 1 to 3, the antenna 10, and a signal processing circuit 9. The signal processing circuit 9 is connected to the first radio frequency module 1. In more detail, the signal processing circuit 9 is connected to the first radio frequency module 1 with the second radio frequency module 2 and the third radio frequency module 3 interposed therebetween.

5.1. Antenna

The antenna 10 is connected to the antenna terminal 81 of the first radio frequency module 1. The antenna 10 has a transmission function and a reception function. Through the transmission function, the antenna 10 emits, as radio waves, transmission signals output from the first radio frequency module 1. Through the reception function, the antenna 10 receives reception signals as radio waves from the outside and outputs the received signals to the first radio frequency module 1.

5.2. Second Radio Frequency Module

The second radio frequency module 2 includes, as illustrated in FIG. 3, a multiplexer 21, a switch 22, the power amplifier 23, a low noise amplifier 24, and first to third signal terminals 251 to 253.

The multiplexer 21 includes a plurality of filters 211 to 213 (three filters in the illustrated example). The filter 211 is, for example, a transmission filter that allows transmission signals of the transmission bands of the first communication band and the third communication band to pass therethrough. The filter 212 is, for example, a reception filter that allows reception signals of the reception band of the first communication band to pass therethrough. The filter 213 is, for example, a reception filter that allows reception signals of the reception band of the third communication band to pass therethrough. The filter 211 is provided on a signal path between the switch 22 and the power amplifier 23. The filters 212 and 213 are provided on signal paths between the switch 22 and the low noise amplifier 24.

The switch 22 switches a filter connected to the first radio frequency module 1 among the plurality of filters 211 to 213. That is, the switch 22 is a switch for switching a path connected to the first radio frequency module 1. The switch 22 has a common terminal 220 and a plurality of selection terminals 221 to 223 (three selection terminals in the illustrated example). The common terminal 220 is connected to the first signal terminal 251. The selection terminal 221 is connected to the filter 211. The selection terminal 222 is connected to the filter 212. The selection terminal 223 is connected to the filter 213.

The switch 22 switches the connection state between the common terminal 220 and the plurality of selection terminals 221 to 223. The switch 22 is controlled by, for example, the signal processing circuit 9. The switch 22 electrically connects, in accordance with a control signal from an RF signal processing circuit 91 of the signal processing circuit 9, the common terminal 220 and at least one of the selection terminals 221 to 223 to each other.

The power amplifier 23 is an amplifier that amplifies transmission signals. The power amplifier 23 is provided between the filter 211 and the second signal terminal 252. The power amplifier 23 has an input terminal (not illustrated) and an output terminal (not illustrated). The input terminal of the power amplifier 23 is connected to an external circuit (for example, the signal processing circuit 9) with the second signal terminal 252 interposed therebetween. The output terminal of the power amplifier 23 is connected to the filter 211. The power amplifier 23 is controlled by, for example, a controller (not illustrated).

The low noise amplifier 24 is an amplifier that amplifies, with low noise, reception signals. The low noise amplifier 24 is provided between the third signal terminal 253 and the filters 212 and 213. The low noise amplifier 24 has an input terminal (not illustrated) and an output terminal (not illustrated). The input terminal of the low noise amplifier 24 is connected to the filters 212 and 213. The output terminal of the low noise amplifier 24 is connected to an external circuit (for example, the signal processing circuit 9) with the third signal terminal 253 interposed therebetween.

The first signal terminal 251 is a terminal for electrical connection to the first radio frequency module 1. The first signal terminal 251 is connected to the first signal terminal 82 of the first radio frequency module 1. In the second radio frequency module 2, the first signal terminal 251 is connected to the common terminal 220 of the switch 22.

The second signal terminal 252 and the third signal terminal 253 are terminals for electrical connection to the signal processing circuit 9. In the second radio frequency module 2, the second signal terminal 252 is connected to the input terminal of the power amplifier 23. In the second radio frequency module 2, the third signal terminal 253 is connected to the output terminal of the low noise amplifier 24.

5.3. Third Radio Frequency Module

The third radio frequency module 3 includes, as illustrated in FIG. 3, a multiplexer 31, a switch 32, the power amplifier 33, a low noise amplifier 34, and first to third signal terminals 351 to 353.

The multiplexer 31 includes a plurality of filters 311 to 313 (three filters in the illustrated example). The filter 311 is, for example, a transmission filter that allows transmission signals of the transmission bands of the second communication band and the fourth communication band to pass therethrough. The filter 312 is, for example, a reception filter that allows reception signals of the reception band of the second communication band to pass therethrough. The filter 313 is, for example, a reception filter that allows reception signals of the reception band of the fourth communication band to pass therethrough. The filter 311 is provided on a signal path between the switch 32 and the power amplifier 33. The filters 312 and 313 are provided on signal paths between the switch 32 and the low noise amplifier 34.

The switch 32 switches a filter connected to the first radio frequency module 1 among the plurality of filters 311 to 313. That is, the switch 32 is a switch for switching a path connected to the first radio frequency module 1. The switch 32 has a common terminal 320 and a plurality of selection terminals 321 to 323 (three selection terminals in the illustrated example). The common terminal 320 is connected to the first signal terminal 351. The selection terminal 321 is connected to the filter 311. The selection terminal 322 is connected to the filter 312. The selection terminal 323 is connected to the filter 313.

The switch 32 switches the connection state between the common terminal 320 and the plurality of selection terminals 321 to 323. The switch 32 is controlled by, for example, the signal processing circuit 9. The switch 32 electrically connects, in accordance with a control signal from the RF signal processing circuit 91 of the signal processing circuit 9, the common terminal 320 and at least one of the selection terminals 321 to 323 to each other.

The power amplifier 33 is an amplifier that amplifies transmission signals. The power amplifier 33 is provided between the filter 311 and the second signal terminal 352. The power amplifier 33 has an input terminal (not illustrated) and an output terminal (not illustrated). The input terminal of the power amplifier 33 is connected to an external circuit (for example, the signal processing circuit 9) with the second signal terminal 352 interposed therebetween. The output terminal of the power amplifier 33 is connected to the filter 311. The power amplifier 33 is controlled by, for example, a controller (not illustrated).

The low noise amplifier 34 is an amplifier that amplifies, with low noise, reception signals. The low noise amplifier 34 is provided between the third signal terminal 353 and the filters 312 and 313. The low noise amplifier 34 has an input terminal (not illustrated) and an output terminal (not illustrated). The input terminal of the low noise amplifier 34 is connected to the filters 312 and 313. The output terminal of the low noise amplifier 34 is connected to an external circuit (for example, the signal processing circuit 9) with the third signal terminal 353 interposed therebetween.

The first signal terminal 351 is a terminal for electrical connection to the first radio frequency module 1. The first signal terminal 351 is connected to the second signal terminal 83 of the first radio frequency module 1. In the third radio frequency module 3, the first signal terminal 351 is connected to the common terminal 320 of the switch 32.

The second signal terminal 352 and the third signal terminal 353 are terminals for electrical connection to the signal processing circuit 9. In the third radio frequency module 3, the second signal terminal 352 is connected to the input terminal of the power amplifier 33. In the third radio frequency module 3, the third signal terminal 353 is connected to the output terminal of the low noise amplifier 34.

5.4. Signal Processing Circuit

The signal processing circuit 9 includes the RF signal processing circuit 91 and a baseband signal processing circuit 92.

The RF signal processing circuit 91 is, for example, a radio frequency integrated circuit (RFIC). The RF signal processing circuit 91 performs signal processing on radio frequency signals. The RF signal processing circuit 91 performs signal processing such as up-converting on a radio frequency signal output from the baseband signal processing circuit 92, and outputs the radio frequency signal subjected to the signal processing to the second radio frequency module 2 and the third radio frequency module 3. Moreover, the RF signal processing circuit 91 performs signal processing such as down-converting on radio frequency signals output from the second radio frequency module 2 and the third radio frequency module 3, and outputs the radio frequency signals subjected to the signal processing to the baseband signal processing circuit 92.

The baseband signal processing circuit 92 is, for example, a baseband integrated circuit (BBIC). The baseband signal processing circuit 92 performs predetermined signal processing on a transmission signal received from outside the signal processing circuit 9. The signal received and processed by the baseband signal processing circuit 92 is used, for example, as an image signal for displaying an image as an image signal or as an audio signal for a telephone call.

6. Layout

6.1. Radio Frequency Module

First, the layout of the radio frequency module 1 will be described with reference to FIG. 1.

As described above, the first to fifth electronic components 201 to 205 are arranged on the first main surface 41 of the mounting substrate 4.

The second electronic component 202 and the third electronic component 203 are arranged in a first direction D21. In more detail, the second electronic component 202 and the third electronic component 203 are adjacent to each other in the first direction D21. "The second electronic component 202 and the third electronic component 203 are adjacent to each other" refers to there not being a circuit element between the second electronic component 202 and the third electronic component 203, and the second electronic component 202 and the third electronic component 203 being next to each other. The first direction D21 is a direction perpendicular to the thickness direction D1 of the mounting substrate 4 (see FIG. 2) and along the short side direction of the mounting substrate 4 (the up-down direction in FIG. 1).

The second and third electronic components 202 and 203 and the first electronic component 201 are arranged in the second direction D22, which intersects the first direction D21. In more detail, the second electronic component 202 and the first electronic component 201 are adjacent to each other in the second direction D22, and the third electronic component 203 and the first electronic component 201 are adjacent to each other in the second direction D22. "The second and third electronic components 202 and 203 and the first electronic component 201 are adjacent to each other" refers to there not being a circuit element between the second electronic component 202 and the first electronic component 201 and between the third electronic component 203 and the first electronic component 201, and the second electronic component 202 and the first electronic component 201 being next to each other and the third electronic component 203 and the first electronic component 201 being next to each other. The second direction D22 is a direction along the long side direction of the mounting substrate 4 (the left-right direction in FIG. 1). In the present embodiment, the first direction D21 is perpendicular to the second direction D22.

In the second direction D22, the fourth electronic component 204 is positioned on the opposite side of the second electronic component 202 and the third electronic component 203 from the first electronic component 201 side. That is, the fourth electronic component 204 is adjacent to the second electronic component 202 and the third electronic component 203 in the second direction D22. "The fourth electronic component 204 is adjacent to the second electronic component 202 and the third electronic component 203" refers to there not being a circuit between the fourth electronic component 204 and the second electronic component 202 and between the fourth electronic component 204 and the third electronic component 203, and the fourth electronic component 204 being next to the second electronic component 202 and next to the third electronic component 203.

The first electronic component 201, the second electronic component 202, the third electronic component 203, and the fourth electronic component 204 are arranged in the second direction D22 in the order of the first electronic component 201, the second and third electronic components 202 and 203, and the fourth electronic component 204 from the right. In short, the second electronic component 202 and the third electronic component 203 are positioned between the first electronic component 201 and the fourth electronic component 204 in the second direction D22.

The fourth electronic component 204 and the fifth electronic component 205 are arranged in the first direction D21. That is, the fourth electronic component 204 and the fifth electronic component 205 are adjacent to each other in the second direction D22. "The fourth electronic component 204 and the fifth electronic component 205 are adjacent to each other" refers to there not being a circuit element between the fourth electronic component 204 and the fifth electronic component 205, and the fourth electronic component 204 and the fifth electronic component 205 being next to each other.

6.2. First Electronic Component

Next, the layout of the first switch 13, the second switch 14, and the control circuit 16 in the first electronic component 201 will be described with reference to FIG. 1.

The first switch 13, the second switch 14, and the control circuit 16 are arranged in the first direction D21 in the first electronic component 201. In more detail, the first switch 13, the second switch 14, and the control circuit 16 are arranged in the first direction D21 in the order of the first switch 13, the control circuit 16, and the second switch 14 from the top.

That is, the control circuit 16 is positioned between the first switch 13 and the second switch 14 in the first direction D21.

7. Connection Example

Next, an example of connection between the first electronic component 201 and the second and third electronic components 202 and 203 will be described with reference to FIG. 4.

The first switch 13 included in the first electronic component 201 and the first filter 111 included in the second electronic component 202 are connected to each other by a first wiring pattern portion 441. In more detail, the selection terminal 131 of the first switch 13 and the first input-output terminal 101 of the first filter 111 are connected to each other by the first wiring pattern portion 441, which is formed on the first main surface 41 of the mounting substrate 4 or inside the mounting substrate 4.

The second switch 14 included in the first electronic component 201 and the second filter 112 included in the second electronic component 202 are connected to each other by a second wiring pattern portion 442. In more detail, the selection terminal 141 of the second switch 14 and the first input-output terminal 103 of the second filter 112 are connected to each other by the second wiring pattern portion 442, which is formed on the first main surface 41 of the mounting substrate 4 or inside the mounting substrate 4.

The first switch 13 included in the first electronic component 201 and the third filter 121 included in the third electronic component 203 are connected to each other by a third wiring pattern portion 443. In more detail, the selection terminal 132 of the first switch 13 and the first input-output terminal 105 of the third filter 121 are connected to each other by the third wiring pattern portion 443, which is formed on the first main surface 41 of the mounting substrate 4 or inside the mounting substrate 4.

The second switch 14 included in the first electronic component 201 and the fourth filter 122 included in the third electronic component 203 are connected to each other by a fourth wiring pattern portion 444. In more detail, the selection terminal 142 of the second switch 14 and the first input-output terminal 107 of the fourth filter 122 are connected to each other by the fourth wiring pattern portion 444, which is formed on the first main surface 41 of the mounting substrate 4 or inside the mounting substrate 4. In this case, the second wiring pattern portion 442 and the third wiring pattern portion 443 intersect each other in a plan view from the thickness direction D1 of the mounting substrate 4; however, the second wiring pattern portion 442 and the third wiring pattern portion 443 are spaced apart from each other in the thickness direction D1 of the mounting substrate 4 (the direction perpendicular to the sheet of FIG. 4) and are not in contact with each other.

Figure 4:
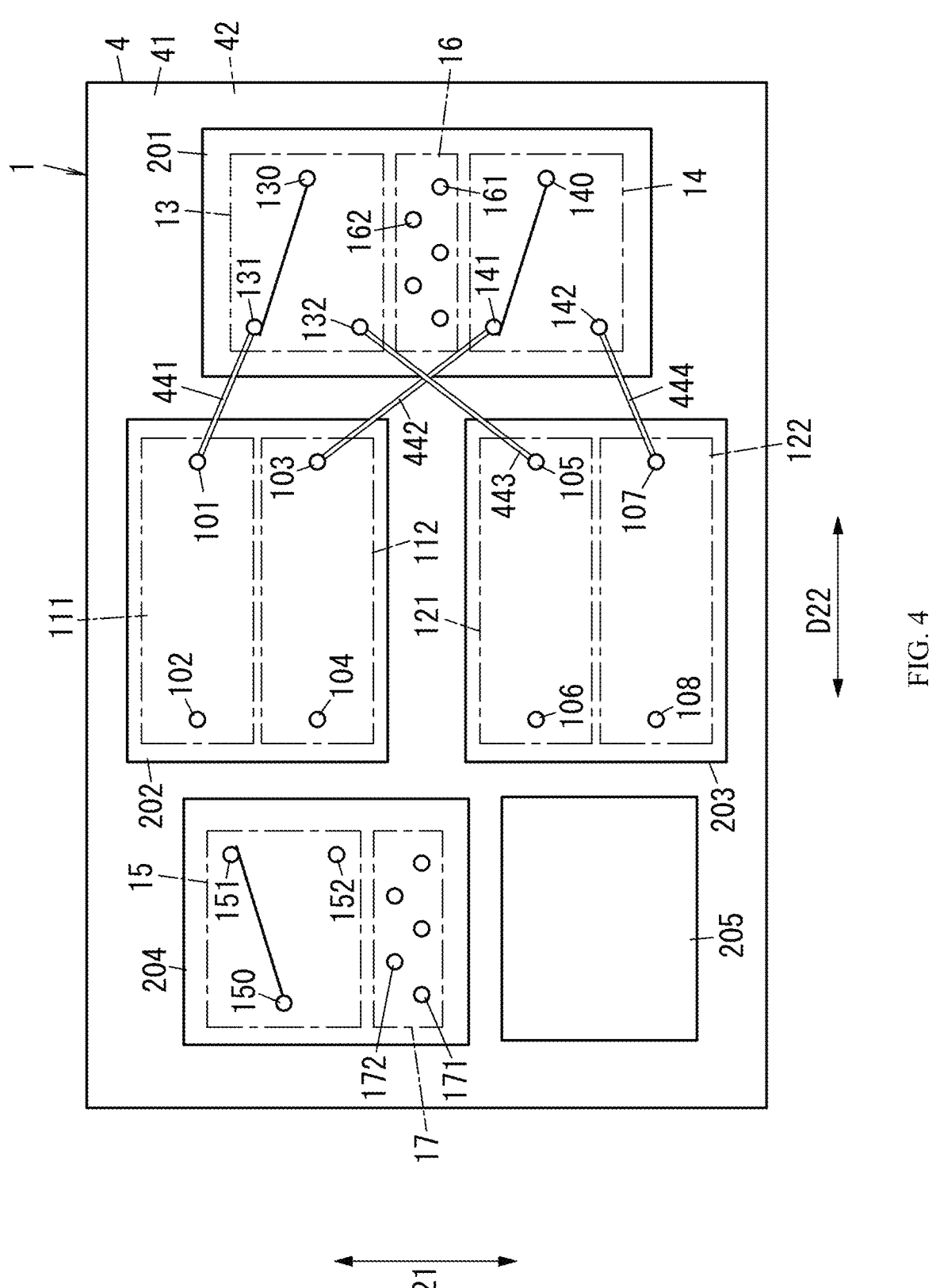
FIG. 4 is a schematic diagram illustrating an example of connection between electronic components regarding the radio frequency module according to the first embodiment.

In this case, in the example illustrated in FIG. 4, the common terminal 130 and the selection terminal 131 of the first switch 13 are connected to each other, and the first wiring pattern portion 441, which connects the first switch 13 and the first filter 111 to each other, is in an active state. Moreover, in the example illustrated in FIG. 4, the common terminal 140 and the selection terminal 141 of the second switch 14 are connected to each other, and the second wiring pattern portion 442, which connects the second switch 14 and the second filter 112 to each other, is in an active state. That is, in the example illustrated in FIG. 4, a plurality of signals through simultaneous communication pass through the first wiring pattern portion 441 and the second wiring pattern portion 442. The first wiring pattern portion 441 and the second wiring pattern portion 442, which are both in the active states, do not intersect each other. The third wiring pattern portion 443 intersects the second wiring pattern portion 442 but does not intersect the first wiring pattern portion 441. The fourth wiring pattern portion 444 does not intersect either of the first wiring pattern portion 441 and the second wiring pattern portion 442.

Moreover, in the example illustrated in FIG. 4, in the first electronic component 201, the control circuit 16 positioned between the first switch 13 and the second switch 14 has the plurality of ground terminals 161 (three ground terminals in the illustrated example). The plurality of ground terminals 161 are positioned on the second switch 14 side in the first direction D21 (the direction in which the first switch 13, the second switch 14, and the control circuit 16 are arranged). That is, the plurality of ground terminals 161 are positioned between the second switch 14 and the control circuit 16 in the first direction D21.

8. Effects

In the radio frequency module 1 according to the first embodiment, in the first electronic component 201, the control circuit 16 is positioned between the first switch 13 and the second switch 14. Thus, it becomes possible to physically space the first switch 13 and the second switch 14 apart from each other, so that a reduction in the degree of isolation between the first switch 13 and the second switch 14 can be suppressed. This can suppress entry of a signal from the first switch 13 into the second switch 14 and entry of a signal from the second switch 14 into the first switch 13. As a result, the degree of isolation between signals can be improved.

In the radio frequency module 1 according to the first embodiment, the ground terminals 161 are positioned between the second switch 14 and the control circuit 16. Thus, due to the shielding effect of the ground terminals 161, a reduction in the degree of isolation between the first switch 13 and the second switch 14 can further be suppressed.

Moreover, in the radio frequency module 1 according to the first embodiment, the first wiring pattern portion 441 and the second wiring pattern portion 442, which are both in the active states, do not intersect each other. Furthermore, there is not a wiring pattern portion that intersects both of the first wiring pattern portion 441 and the second wiring pattern portion 442. This can suppress entry of a signal from one wiring pattern portion to another wiring pattern portion among the wiring pattern portions.

Moreover, in the radio frequency module 1 according to the first embodiment, in a plan view from the thickness direction D1 of the mounting substrate 4, the second electronic component 202 and the third electronic component 203 are arranged in the first direction D21. Moreover, in a plan view from the thickness direction D1 of the mounting substrate 4, the second and third electronic components 202 and 203 and the first electronic component 201 are arranged in the second direction D22. Thus, it becomes possible to reduce a wiring length between the second electronic component 202 and the first electronic component 201 and a wiring length between the third electronic component 203 and the first electronic component 201. As a result, signal loss due to a wiring length can be reduced.

Moreover, in the radio frequency module 1 according to the first embodiment, the fourth electronic component 204 is positioned on the opposite side of the second electronic component 202 and the third electronic component 203 from the first electronic component 201 side in a plan view from the thickness direction D1 of the mounting substrate 4. Thus, it becomes possible to reduce a wiring length between the second electronic component 202 and the fourth electronic component 204 and a wiring length between the third electronic component 203 and the fourth electronic component 204. As a result, signal loss due to a wiring length can be reduced.

Moreover, in the radio frequency module 1 according to the first embodiment, the first filter 111 and the third filter 121 whose pass bands partially overlap are provided in separate electronic components (the second electronic component 202 and the third electronic component 203). Thus, it becomes possible to improve the degree of isolation between the first filter 111 and the third filter 121.

9. Modifications

9.1. First Modification

Figure 5:
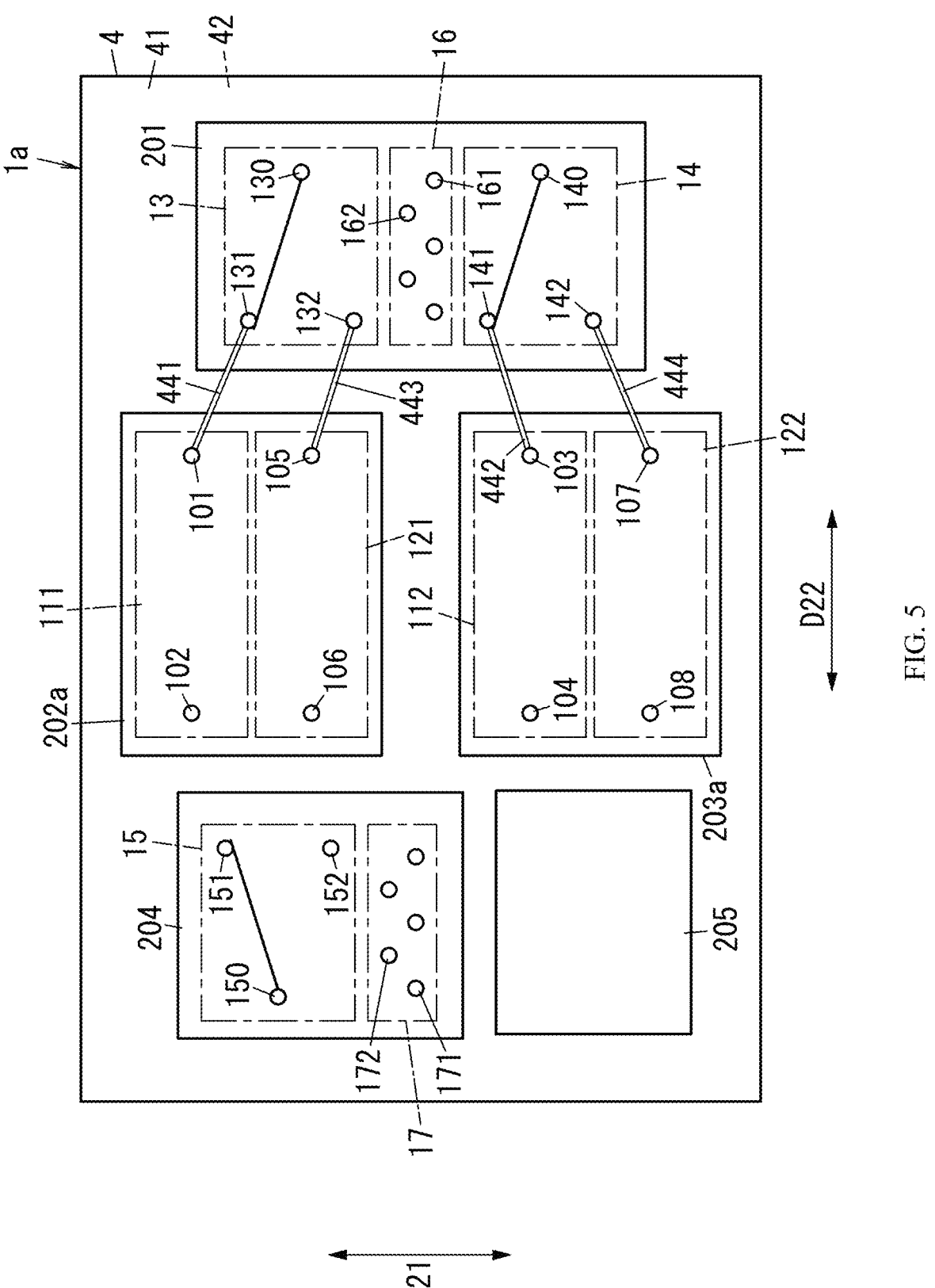
FIG. 5 is a schematic diagram illustrating an example of connection between electronic components regarding a radio frequency module according to a first modification of the first embodiment.

In the first embodiment, the first filter 111 and the second filter 112 are provided in the second electronic component 202, and the third filter 121 and the fourth filter 122 are provided in the third electronic component 203. In contrast, as illustrated in FIG. 5, the first filter 111 and the third filter 121 may be provided in a second electronic component 202a, and the second filter 112 and the fourth filter 122 may be provided in a third electronic component 203a. In the following, a radio frequency module 1a according to a first modification will be described with reference to FIG. 5. Note that, regarding the radio frequency module 1a according to the first modification, configurations substantially the same as those of the radio frequency module 1 according to the first embodiment will be denoted by the same reference symbols, and description will be omitted.

In the radio frequency module 1a according to the first modification, as illustrated in FIG. 5, the first to fifth electronic components 201 to 205 are arranged on the first main surface 41 of the mounting substrate 4. The second electronic component 202a and the third electronic component 203a are arranged in the first direction D21. The second electronic component 202a and the first electronic component 201 are arranged in the second direction D22, and the third electronic component 203a and the first electronic component 201 are arranged in the second direction D22. In the second direction D22, the fourth electronic component 204 is positioned on the opposite side of the second electronic component 202a and the third electronic component 203a from the first electronic component 201 side. The fourth electronic component 204 and the fifth electronic component 205 are arranged in the first direction D21.

In the radio frequency module 1a according to the first modification, as illustrated in FIG. 5, the first filter 111 and the third filter 121 are provided in the second electronic component 202a. Moreover, in the radio frequency module 1a according to the first modification, the second filter 112 and the fourth filter 122 are provided in the third electronic component 203a. As a result, it becomes possible to arrange the individual wiring pattern portions such that none of the first wiring pattern portion 441, the second wiring pattern portion 442, the third wiring pattern portion 443, and the fourth wiring pattern portion 444 intersect each other.

9.2 Second Modification

Figure 6:
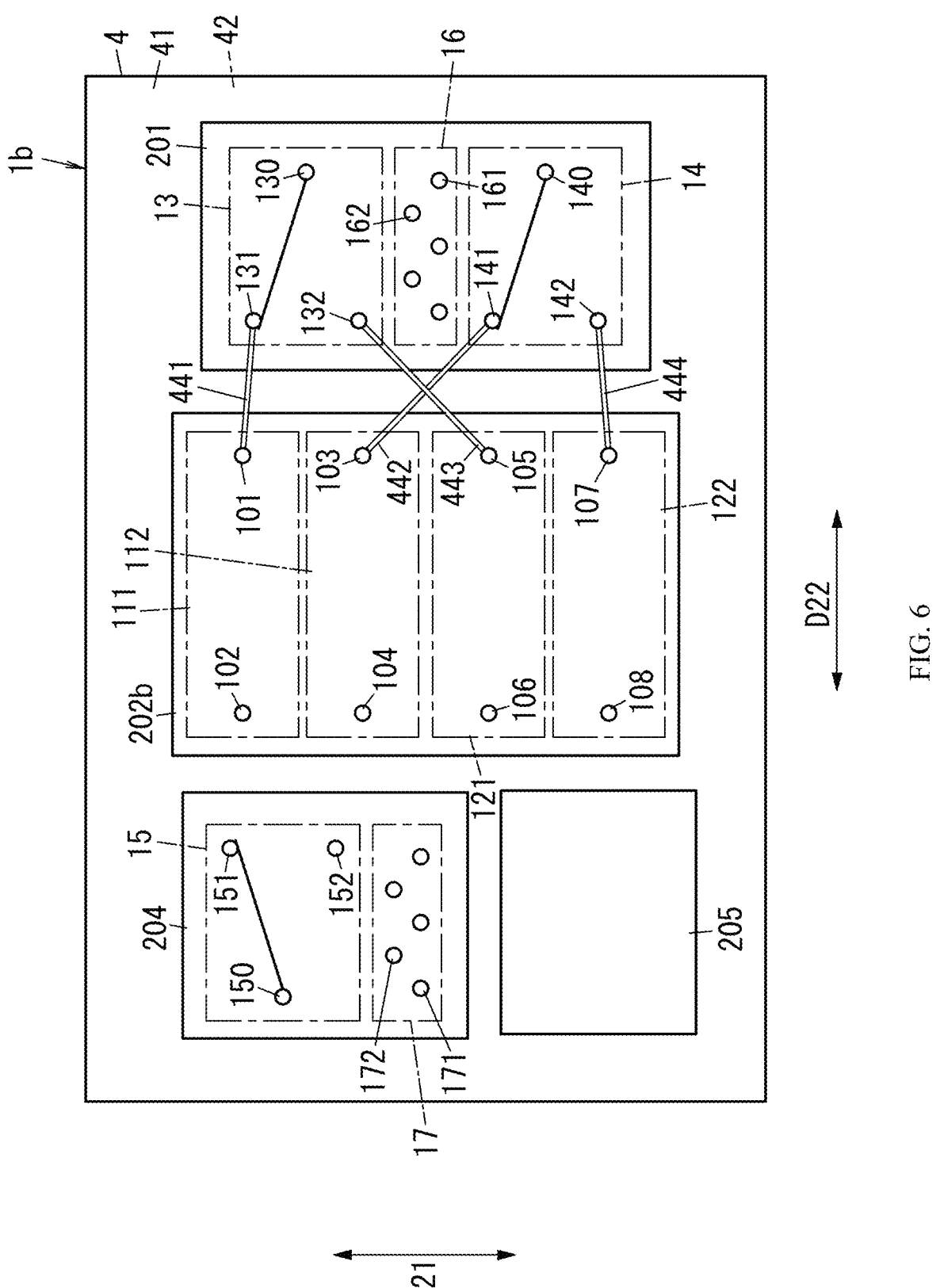
FIG. 6 is a schematic diagram illustrating an example of connection between electronic components regarding a radio frequency module according to a second modification of the first embodiment.

In the first embodiment, the first filter 111 and the second filter 112 are provided in the second electronic component 202, and the third filter 121 and the fourth filter 122 are provided in the third electronic component 203. In contrast, as illustrated in FIG. 6, the first filter 111, the second filter 112, the third filter 121, and the fourth filter 122 may be provided in a second electronic component 202b. In the following, a radio frequency module 1b according to a second modification will be described with reference to FIG. 6. Note that, regarding the radio frequency module 1b according to the second modification, configurations substantially the same as those of the radio frequency module 1 according to the first embodiment will be denoted by the same reference symbols, and description will be omitted.

In the radio frequency module 1b according to the second modification, as illustrated in FIG. 6, the first electronic component 201, the second electronic component 202b, the fourth electronic component 204, and the fifth electronic component 205 are arranged on the first main surface 41 of the mounting substrate 4. The first electronic component 201 and the second electronic component 202b are arranged in the second direction D22. In the second direction D22, the fourth electronic component 204 is positioned on the opposite side of the second electronic component 202b from the first electronic component 201 side. The fourth electronic component 204 and the fifth electronic component 205 are arranged in the first direction D21.

In the radio frequency module 1b according to the second modification, as illustrated in FIG. 6, the first filter 111, the second filter 112, the third filter 121, and the fourth filter 122 are provided in the second electronic component 202b. Thus, the radio frequency module 1b can be made smaller than the radio frequency module 1 according to the first embodiment and the radio frequency module 1a according to the first modification.

Second Embodiment

A radio frequency module 1c and a communication device 100c according to the second embodiment will be described with reference to FIG. 7. Regarding the radio frequency module 1c and the communication device 100c according to the second embodiment, configurations substantially the same as those of the radio frequency module 1 and those of the communication device 100 according to the first embodiment (see FIGS. 1 and 3) will be denoted by the same reference symbols, and description will be omitted.

Figure 7:
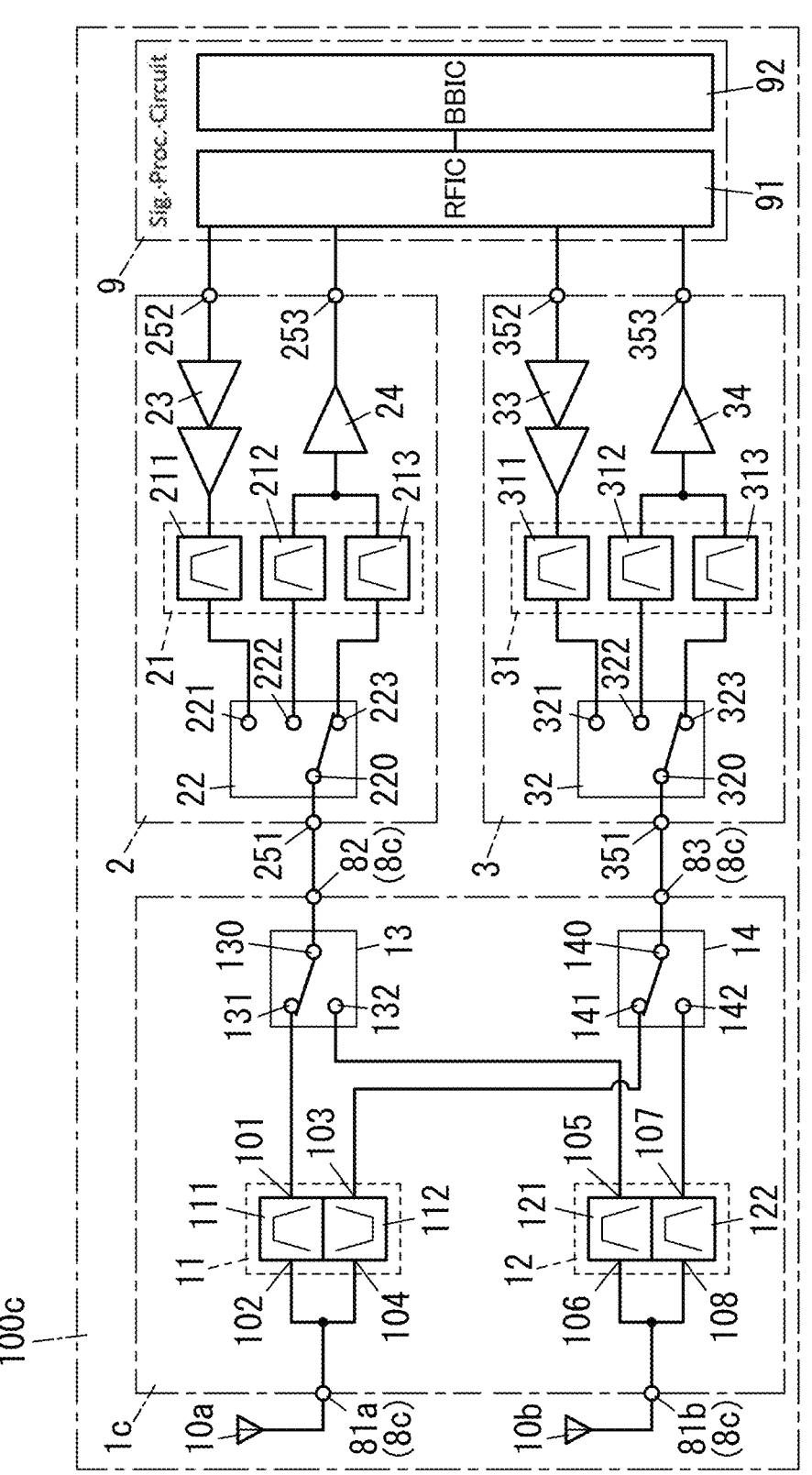
FIG. 7 is a circuit configuration diagram of a communication device including a radio frequency module according to a second embodiment.

The radio frequency module 1c according to the second embodiment is different from the radio frequency module 1 according to the first embodiment in that, as illustrated in FIG. 7, the third switch 15 is omitted, the multiplexer 11 is connected to a first antenna 10a, and the multiplexer 12 is connected to a second antenna 10b.

1. Configuration

The communication device 100c according to the second embodiment includes, as illustrated in FIG. 7, the first to third radio frequency modules 1c, 2, and 3, the first antenna 10a and the second antenna 10b, and the signal processing circuit 9.

The radio frequency module 1c according to the second embodiment includes, as illustrated in FIG. 7, the plurality of multiplexers 11 and 12 (two multiplexes in the illustrated example), the first switch 13, and the second switch 14. The radio frequency module 1c according to the second embodiment further includes the plurality of control circuits 16 and 17 (see FIG. 1). Moreover, the radio frequency module 1c according to the second embodiment further includes a plurality of external connection terminals 8c (four external connection terminals in the illustrated example). The plurality of external connection terminals 8*c* include a first antenna terminal 81*a*, a second antenna terminal 81*b*, the first signal terminal 82, and the second signal terminal 83.

The first filter 111 and the second filter 112 are connected to the first antenna terminal 81*a*. Moreover, the first filter 111 and the second filter 112 are connected to the first antenna 10*a* with the first antenna terminal 81*a* interposed therebetween. The third filter 121 and the fourth filter 122 are connected to the second antenna terminal 81*b*. Moreover, the third filter 121 and the fourth filter 122 are connected to the second antenna 10*b* with the second antenna terminal 81*b* interposed therebetween.

2. Effects

In the radio frequency module 1*c* according to the second embodiment, similarly to as in the radio frequency module 1 according to the first embodiment, the control circuit 16 is positioned between the first switch 13 and the second switch 14 in the first electronic component 201, which is a single electronic component. Thus, it becomes possible to physically space the first switch 13 and the second switch 14 apart from each other, so that a reduction in the degree of isolation between the first switch 13 and the second switch 14 can be suppressed. This can suppress entry of a signal from the first switch 13 into the second switch 14 and entry of a signal from the second switch 14 into the first switch 13. As a result, the degree of isolation between signals can be improved.

In the radio frequency module 1*c* according to the second embodiment, the size of the radio frequency module 1*c* can be reduced by omitting the third switch 15.

Third Embodiment

A radio frequency module 1*d* and a communication device 100*d* according to the third embodiment will be described with reference to FIGS. 8 and 9. Regarding the radio frequency module 1*d* and the communication device 100*d* according to the third embodiment, configurations substantially the same as those of the radio frequency module 1 and those of the communication device 100 according to the first embodiment (see FIGS. 1 and 3) will be denoted by the same reference symbols, and description will be omitted.

The radio frequency module 1*d* according to the third embodiment is different from the radio frequency module 1 according to the first embodiment in that the radio frequency module 1*d* according to the third embodiment includes a multiplexer 18. Moreover, the radio frequency module 1*d* according to the third embodiment is different from the radio frequency module 1 according to the first embodiment in that a first switch 13*d* has a third selection terminal 133. Moreover, the radio frequency module 1*d* according to the third embodiment is different from the radio frequency module 1 according to the first embodiment in that a second switch 14*d* has a third selection terminal 143. Moreover, the radio frequency module 1*d* according to the third embodiment is different from the radio frequency module 1 according to the first embodiment in that a third switch 15*d* has a third selection terminal 153.

1. Configuration

Figure 8:
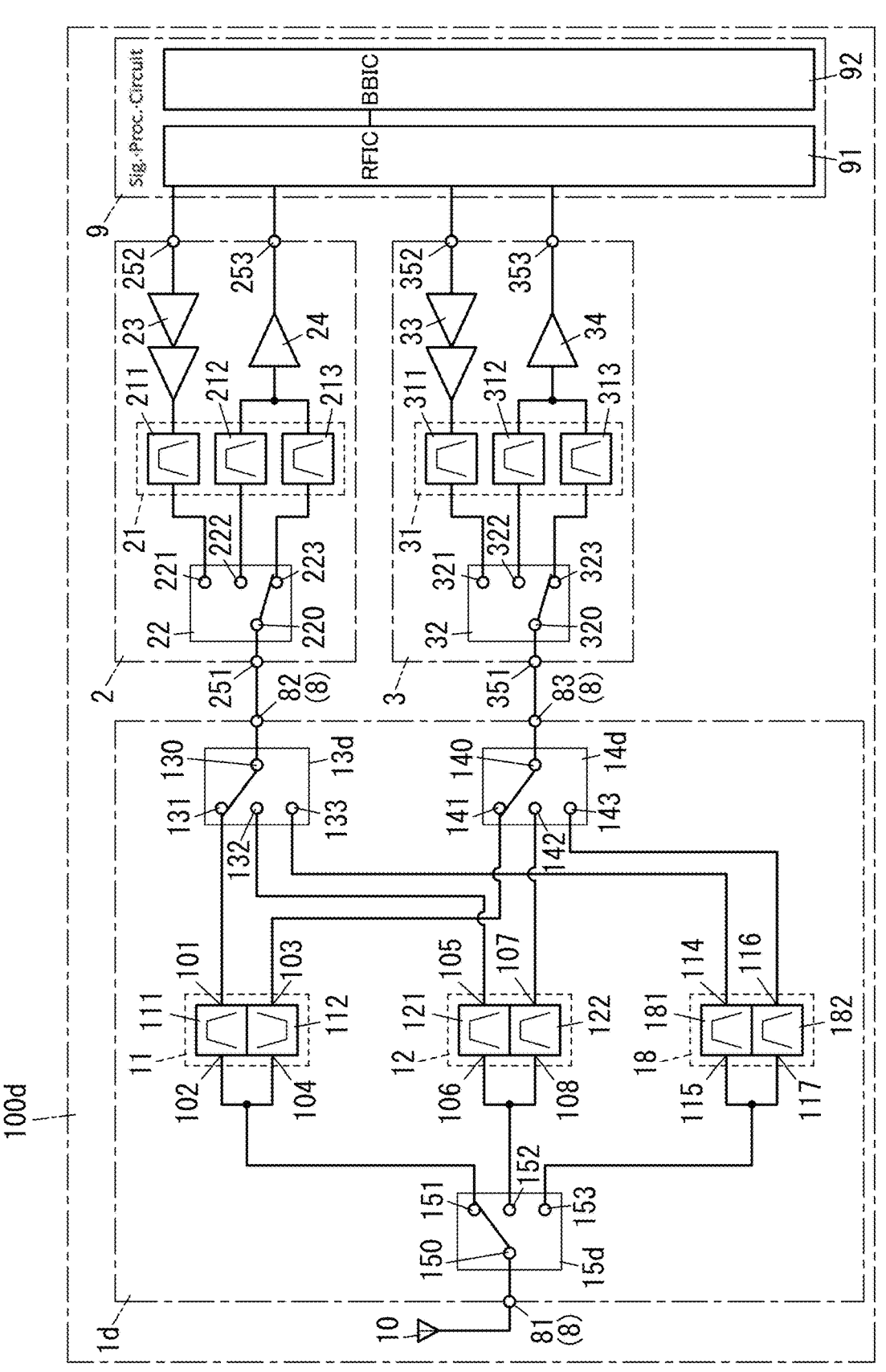
FIG. 8 is a circuit configuration diagram of a communication device including a radio frequency module according to a third embodiment.

The communication device 100*d* according to the third embodiment includes, as illustrated in FIG. 8, the first to third radio frequency modules 1*d*, 2, and 3, the antenna 10, and the signal processing circuit 9.

The radio frequency module 1*d* according to the third embodiment includes, as illustrated in FIG. 8, the plurality of multiplexers 11, 12, and 18 (three multiplexers in the illustrated example), the first switch 13*d*, the second switch 14*d*, and the third switch 15*d*. The radio frequency module 1*d* according to the third embodiment further includes the plurality of control circuits 16 and 17 (see FIG. 9). The radio frequency module 1*d* according to the third embodiment further includes the plurality of external connection terminals 8 (three external connection terminals in the illustrated example).

The first switch 13*d* has the common terminal 130 and the plurality of selection terminals 131 to 133 (three selection terminals in the illustrated example). The second switch 14*d* has the common terminal 140 and the plurality of selection terminals 141 to 143 (three selection terminals in the illustrated example). The third switch 15*d* has the common terminal 150 and the plurality of selection terminals 151 to 153 (three selection terminals in the illustrated example).

The multiplexer 11 includes the first filter 111 and the second filter 112. The first filter 111 has the first input-output terminal 101 and the second input-output terminal 102. The first input-output terminal 101 of the first filter 111 is connected to the selection terminal 131 of the first switch 13*d*. The second input-output terminal 102 of the first filter 111 is connected to the selection terminal 151 of the third switch 15*d*. The second filter 112 has the first input-output terminal 103 and the second input-output terminal 104. The first input-output terminal 103 of the second filter 112 is connected to the selection terminal 141 of the second switch 14*d*. The second input-output terminal 104 of the second filter 112 is connected to the selection terminal 151 of the third switch 15*d*.

The multiplexer 12 includes the third filter 121 and the fourth filter 122. The third filter 121 has the first input-output terminal 105 and the second input-output terminal 106. The first input-output terminal 105 of the third filter 121 is connected to the selection terminal 132 of the first switch 13*d*. The second input-output terminal 106 of the third filter 121 is connected to the selection terminal 152 of the third switch 15*d*. The fourth filter 122 has the first input-output terminal 107 and the second input-output terminal 108. The first input-output terminal 107 of the fourth filter 122 is connected to the selection terminal 142 of the second switch 14*d*. The second input-output terminal 108 of the fourth filter 122 is connected to the selection terminal 152 of the third switch 15*d*.

The multiplexer 18 includes a fifth filter 181 and a sixth filter 182. The fifth filter 181 has a first input-output terminal 114 and a second input-output terminal 115. The first input-output terminal 114 of the fifth filter 181 is connected to the selection terminal 133 of the first switch 13*d*. The second input-output terminal 115 of the fifth filter 181 is connected to the selection terminal 153 of the third switch 15*d*. The sixth filter 182 has a first input-output terminal 116 and a second input-output terminal 117. The first input-output terminal 116 of the sixth filter 182 is connected to the selection terminal 143 of the second switch 14*d*. The second input-output terminal 117 of the sixth filter 182 is connected to the selection terminal 153 of the third switch 15*d*.

The fifth filter 181 is, for example, a transmission-reception filter that allows transmission signals and reception signals of a fifth communication band to pass therethrough. The sixth filter 182 is, for example, a transmission-reception filter that allows transmission signals and reception signals of a sixth communication band to pass therethrough.

The common terminal 130 of the first switch 13$d$ is connected to an external circuit (for example, the second radio frequency module 2) with the first signal terminal 82 interposed therebetween. The common terminal 140 of the second switch 14$d$ is connected to an external circuit (for example, the third radio frequency module 3) with the second signal terminal 83 interposed therebetween. The common terminal 150 of the third switch 15$d$ is connected to the antenna 10 with the antenna terminal 81 interposed therebetween.

2. Layout

In the radio frequency module 1$d$ according to the third embodiment, a first electronic component 201$d$, the second electronic component 202, the third electronic component 203, a fourth electronic component 204$d$, the fifth electronic component 205, and a sixth electronic component 206 are arranged on the first main surface 41 of the mounting substrate 4.

The first electronic component 201$d$ includes the first switch 13$d$, the second switch 14$d$, and the control circuit 16. In the first electronic component 201$d$, the control circuit 16 is positioned between the first switch 13$d$ and the second switch 14$d$. The second electronic component 202 includes the first filter 111 and the second filter 112. The third electronic component 203 includes the third filter 121 and the fourth filter 122. The fourth electronic component 204$d$ includes the third switch 15$d$ and the control circuit 17. The sixth electronic component 206 includes the fifth filter 181 and the sixth filter 182.

The second electronic component 202, the third electronic component 203, and the sixth electronic component 206 are arranged in the first direction D21. In more detail, the second electronic component 202, the third electronic component 203, and the sixth electronic component 206 are arranged in the first direction D21 in the order of the second electronic component 202, the third electronic component 203, and the sixth electronic component 206 from the top. The second electronic component 202 and the first electronic component 201$d$ are arranged in the second direction D22, the third electronic component 203 and the first electronic component 201$d$ are arranged in the second direction D22, and the sixth electronic component 206 and the first electronic component 201$d$ are arranged in the second direction D22. The fourth electronic component 204$d$ is positioned on the opposite side of the second electronic component 202, the third electronic component 203, and the sixth electronic component 206 from the first electronic component 201$d$ side in the second direction D22. That is, the second electronic component 202, the third electronic component 203, and the sixth electronic component 206 are positioned between the first electronic component 201$d$ and the fourth electronic component 204$d$ in the second direction D22. The fourth electronic component 204$d$ and the fifth electronic component 205 are arranged in the first direction D21.

3. Connection Example

The first input-output terminal 101 of the first filter 111 and the selection terminal 131 of the first switch 13$d$ are connected to each other by the first wiring pattern portion 441. The first input-output terminal 103 of the second filter 112 and the selection terminal 141 of the second switch 14$d$ are connected to each other by the second wiring pattern portion 442. The first input-output terminal 105 of the third filter 121 and the selection terminal 132 of the first switch 13$d$ are connected to each other by the third wiring pattern portion 443. The first input-output terminal 107 of the fourth filter 122 and the selection terminal 142 of the second switch 14$d$ are connected to each other by the fourth wiring pattern portion 444. The first input-output terminal 114 of the fifth filter 181 and the selection terminal 133 of the first switch 13$d$ are connected to each other by a fifth wiring pattern portion 445. The first input-output terminal 116 of the sixth filter 182 and the selection terminal 143 of the second switch 14$d$ are connected to each other by a sixth wiring pattern portion 446.

Figure 9:
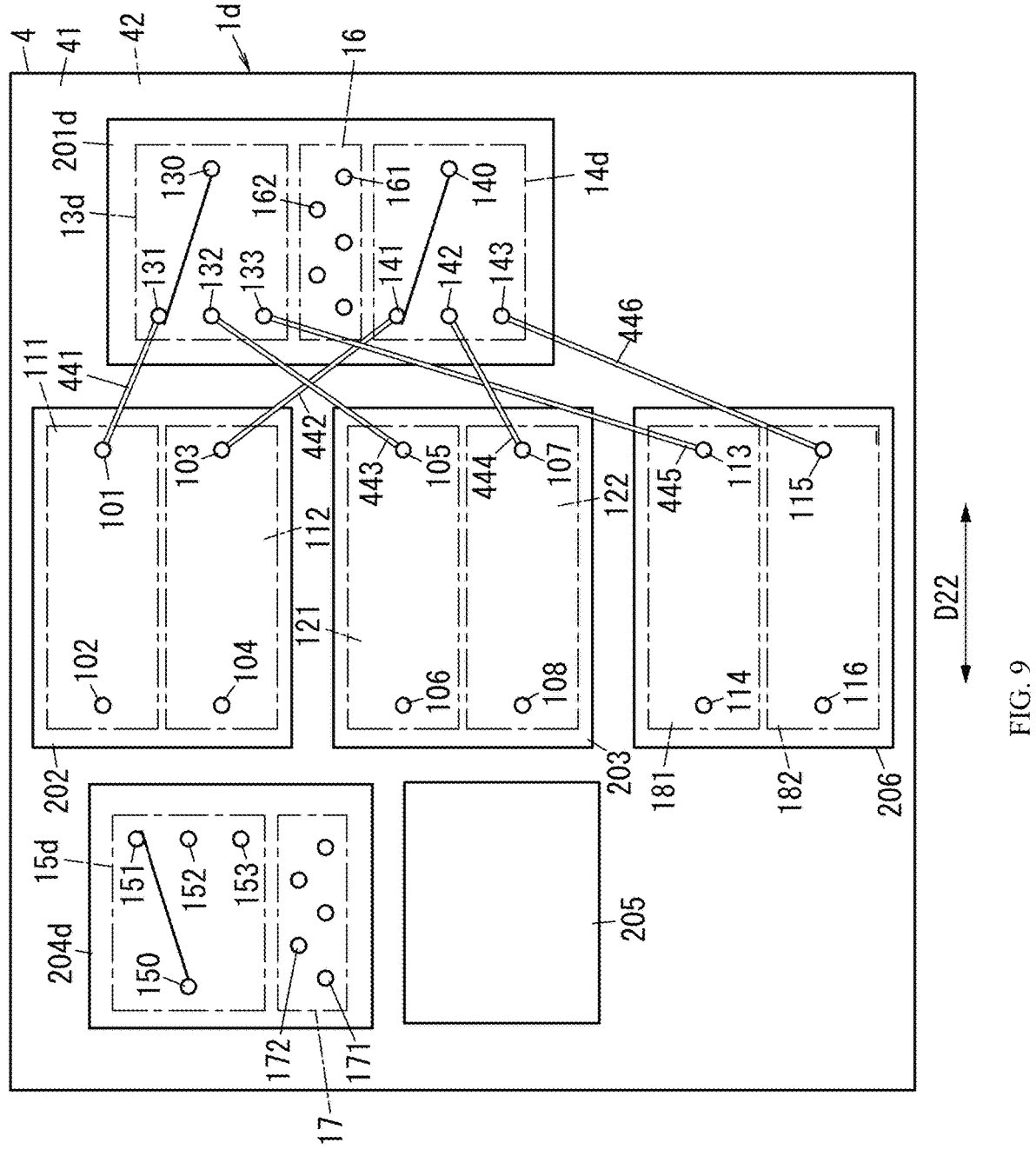
FIG. 9 is a schematic diagram illustrating an example of connection between electronic components regarding the radio frequency module according to the third embodiment.

In this case, in the example illustrated in FIG. 9, the common terminal 130 and the selection terminal 131 of the first switch 13$d$ are connected to each other, and the common terminal 140 and the selection terminal 141 of the second switch 14$d$ are connected to each other. Thus, in the example illustrated in FIG. 9, the first wiring pattern portion 441 and the second wiring pattern portion 442 are in the active states. That is, in the example illustrated in FIG. 9, a plurality of signals through simultaneous communication pass through the first wiring pattern portion 441 and the second wiring pattern portion 442. The first wiring pattern portion 441 and the second wiring pattern portion 442, which are both in the active states, do not intersect each other. Each of the third wiring pattern portion 443 and the fifth wiring pattern portion 445 intersects the second wiring pattern portion 442 but does not intersect the first wiring pattern portion 441. Each of the fourth wiring pattern portion 444 and the sixth wiring pattern portion 446 does not intersect either of the first wiring pattern portion 441 and the second wiring pattern portion 442.

4. Effects

In the radio frequency module 1$d$ according to the third embodiment, similarly to as in the radio frequency module 1 according to the first embodiment, the control circuit 16 is positioned between the first switch 13$d$ and the second switch 14$d$ in the first electronic component 201$d$, which is a single electronic component. Thus, it becomes possible to physically space the first switch 13$d$ and the second switch 14$d$ apart from each other, so that a reduction in the level of isolation between the first switch 13$d$ and the second switch 14$d$ can be suppressed. This can suppress entry of a signal from the first switch 13$d$ into the second switch 14$d$ and entry of a signal from the second switch 14$d$ into the first switch 13$d$. As a result, the degree of isolation between signals can be improved.

Moreover, in the radio frequency module 1$d$ according to the third embodiment, the first wiring pattern portion 441 and the second wiring pattern portion 442, which are both in the active states, do not intersect each other. Furthermore, there is not a wiring pattern portion that intersects both of the first wiring pattern portion 441 and the second wiring pattern portion 442. Thus, a reduction in the degree of isolation between the first switch 13$d$ and the second switch 14$d$ can further be suppressed.

Fourth Embodiment

A radio frequency module 1$e$ and a communication device 100$e$ according to the fourth embodiment will be described with reference to FIGS. 10 and 11. Regarding the radio frequency module 1$e$ and the communication device 100$e$ according to the fourth embodiment, configurations substantially the same as those of the radio frequency module 1 and those of the communication device 100 according to the first embodiment (see FIGS. 1 and 3) will be denoted by the same reference symbols, and description will be omitted.

The radio frequency module 1e according to the fourth embodiment is different from the radio frequency module 1 according to the first embodiment in that the radio frequency module 1e according to the fourth embodiment includes a seventh filter 113, an eighth filter 123, and a fourth switch 19. Moreover, the radio frequency module 1e according to the fourth embodiment is different from the radio frequency module 1 according to the first embodiment in that the radio frequency module 1e according to the fourth embodiment includes a third signal terminal 84. Moreover, the communication device 100e according to the fourth embodiment is different from the communication device 100 according to the first embodiment in that the communication device 100e according to the fourth embodiment includes a fourth radio frequency module 6.

1. Configuration

Figure 10:
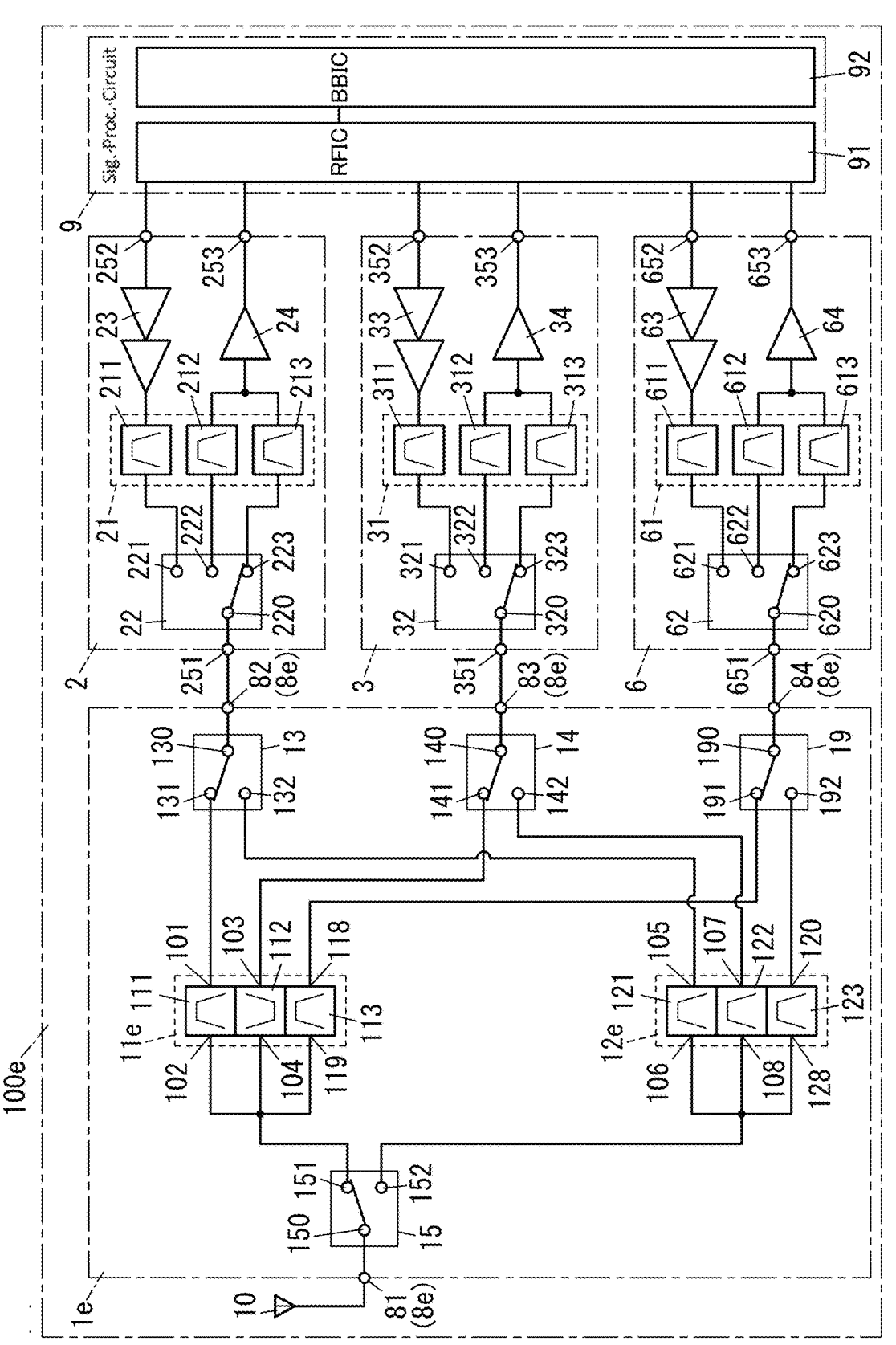
FIG. 10 is a circuit configuration diagram of a communication device including a radio frequency module according to a fourth embodiment.

The communication device 100e according to the fourth embodiment includes, as illustrated in FIG. 10, the first to fourth radio frequency modules 1d, 2, 3, and 6, the antenna 10, and the signal processing circuit 9.

1.1. First Radio Frequency Module

The radio frequency module 1e according to the fourth embodiment includes, as illustrated in FIG. 10, a plurality of multiplexers 11e and 12e (two multiplexers in the illustrated example), the first switch 13, the second switch 14, the third switch 15, and the fourth switch 19. The radio frequency module 1e according to the fourth embodiment further includes the plurality of control circuits 16 and 17 (see FIG. 11). Moreover, the radio frequency module 1e according to the fourth embodiment further includes a plurality of external connection terminals 8e (four external connection terminals in the illustrated example). The plurality of external connection terminals 8e include the antenna terminal 81, the first signal terminal 82, the second signal terminal 83, and the third signal terminal 84.

The first switch 13 has the common terminal 130 and the plurality of selection terminals 131 and 132 (two selection terminals in the illustrated example). The second switch 14 has the common terminal 140 and the plurality of selection terminals 141 and 142 (two selection terminals in the illustrated example). The third switch 15 has the common terminal 150 and the plurality of selection terminals 151 and 152 (two selection terminals in the illustrated example). The fourth switch 19 has a common terminal 190 and a plurality of selection terminals 191 and 192 (two selection terminals in the illustrated example).

The multiplexer 11e includes the first filter 111, the second filter 112, and the seventh filter 113. The first filter 111 has the first input-output terminal 101 and the second input-output terminal 102. The first input-output terminal 101 of the first filter 111 is connected to the selection terminal 131 of the first switch 13. The second input-output terminal 102 of the first filter 111 is connected to the selection terminal 151 of the third switch 15. The second filter 112 has the first input-output terminal 103 and the second input-output terminal 104. The first input-output terminal 103 of the second filter 112 is connected to the selection terminal 141 of the second switch 14. The second input-output terminal 104 of the second filter 112 is connected to the selection terminal 151 of the third switch 15. The seventh filter 113 has a first input-output terminal 118 and a second input-output terminal 119. The first input-output terminal 118 of the seventh filter 113 is connected to the selection terminal 191 of the fourth switch 19. The second input-output terminal 119 of the seventh filter 113 is connected to the selection terminal 151 of the third switch 15.

The multiplexer 12e includes the third filter 121, the fourth filter 122, and the eighth filter 123. The third filter 121 has the first input-output terminal 105 and the second input-output terminal 106. The first input-output terminal 105 of the third filter 121 is connected to the selection terminal 132 of the first switch 13. The second input-output terminal 106 of the third filter 121 is connected to the selection terminal 152 of the third switch 15. The fourth filter 122 has the first input-output terminal 107 and the second input-output terminal 108. The first input-output terminal 107 of the fourth filter 122 is connected to the selection terminal 142 of the second switch 14. The second input-output terminal 108 of the fourth filter 122 is connected to the selection terminal 152 of the third switch 15. The eighth filter 123 has a first input-output terminal 120 and a second input-output terminal 128. The first input-output terminal 120 of the eighth filter 123 is connected to the selection terminal 192 of the fourth switch 19. The second input-output terminal 128 of the eighth filter 123 is connected to the selection terminal 152 of the third switch 15.

The common terminal 130 of the first switch 13 is connected to an external circuit (for example, the second radio frequency module 2) with the first signal terminal 82 interposed therebetween. The common terminal 140 of the second switch 14 is connected to an external circuit (for example, the third radio frequency module 3) with the second signal terminal 83 interposed therebetween. The common terminal 150 of the third switch 15 is connected to the antenna 10 with the antenna terminal 81 interposed therebetween. The common terminal 190 of the fourth switch 19 is connected to an external circuit (for example, the fourth radio frequency module 6) with the third signal terminal 84 interposed therebetween.

1.2. Fourth Radio Frequency Module

The fourth radio frequency module 6 includes, as illustrated in FIG. 10, a multiplexer 61, a switch 62, a power amplifier 63, a low noise amplifier 64, and first to third signal terminals 651 to 653.

The multiplexer 61 includes a plurality of filters 611 to 613 (three filters in the illustrated example). The filter 611 is, for example, a transmission filter that allows transmission signals of the transmission bands of a seventh communication band and an eighth communication band to pass therethrough. The filter 612 is, for example, a reception filter that allows reception signals of the reception band of the seventh communication band to pass therethrough. The filter 613 is, for example, a reception filter that allows reception signals of the reception band of the eighth communication band to pass therethrough. The filter 611 is provided on a signal path between the switch 62 and the power amplifier 63. The filters 612 and 613 are provided on signal paths between the switch 62 and the low noise amplifier 64.

The switch 62 switches a filter connected to the first radio frequency module 1e among the plurality of filters 611 to 613. That is, the switch 62 is a switch for switching a path connected to the first radio frequency module 1e. The switch 62 has a common terminal 620 and a plurality of selection terminals 621 to 623 (three selection terminals in the illustrated example). The common terminal 620 is connected to the first signal terminal 651. The selection terminal 621 is connected to the filter 611. The selection terminal 622 is connected to the filter 612. The selection terminal 623 is connected to the filter 613.

The switch 62 switches the connection state between the common terminal 620 and the plurality of selection terminals 621 to 623. The switch 62 is controlled by, for example, the signal processing circuit 9. The switch 62 electrically connects, in accordance with a control signal from the RF signal processing circuit 91 of the signal processing circuit 9, the common terminal 620 and at least one of the plurality of selection terminals 621 to 623 to each other.

The power amplifier 63 is an amplifier that amplifies transmission signals. The power amplifier 63 is provided between the filter 611 and the second signal terminal 652. The power amplifier 63 has an input terminal (not illustrated) and an output terminal (not illustrated). The input terminal of the power amplifier 63 is connected to an external circuit (for example, the signal processing circuit 9) with the second signal terminal 652 interposed therebetween. The output terminal of the power amplifier 63 is connected to the filter 611. The power amplifier 63 is controlled by, for example, a controller (not illustrated).

The low noise amplifier 64 is an amplifier that amplifies, with low noise, reception signals. The low noise amplifier 64 is provided between the third signal terminal 653 and the filters 612 and 613. The low noise amplifier 64 has an input terminal (not illustrated) and an output terminal (not illustrated). The input terminal of the low noise amplifier 64 is connected to the filters 612 and 613. The output terminal of the low noise amplifier 64 is connected to an external circuit (for example, the signal processing circuit 9) with the third signal terminal 653 interposed therebetween.

The first signal terminal 651 is a terminal for electrical connection to the first radio frequency module 1e. The first signal terminal 651 is connected to the third signal terminal 84 of the first radio frequency module 1e. In the fourth radio frequency module 6, the first signal terminal 651 is connected to the common terminal 620 of the switch 62.

The second signal terminal 652 and the third signal terminal 653 are terminals for electrical connection to the signal processing circuit 9. In the fourth radio frequency module 6, the second signal terminal 652 is connected to the input terminal of the power amplifier 63. In the fourth radio frequency module 6, the third signal terminal 653 is connected to the output terminal of the low noise amplifier 64.

2. Layout

In the radio frequency module 1e according to the fourth embodiment, a first electronic component 201e, the second electronic component 202, the third electronic component 203, the fourth electronic component 204, the fifth electronic component 205, and a seventh electronic component 207 are arranged on the first main surface 41 of the mounting substrate 4.

The first electronic component 201e includes the first switch 13, the second switch 14, the fourth switch 19, and the control circuit 16. In the first electronic component 201e, the control circuit 16 is positioned between the first switch 13 and the second switch 14. That is, the first switch 13, the second switch 14, the fourth switch 19, and the control circuit 16 are arranged in the first electronic component 201e in the order of the first switch 13, the control circuit 16, the second switch 14, and the fourth switch 19 from the top. The second electronic component 202 includes the first filter 111 and the second filter 112. The third electronic component 203 includes the third filter 121 and the fourth filter 122. The fourth electronic component 204 includes the third switch 15 and the control circuit 17. The seventh electronic component 207 includes the seventh filter 113 and the eighth filter 123.

The second electronic component 202, the third electronic component 203, and the seventh electronic component 207 are arranged in the first direction D21. In more detail, the second electronic component 202, the third electronic component 203, and the seventh electronic component 207 are arranged in the first direction D21 in the order of the second electronic component 202, the third electronic component 203, and the seventh electronic component 207 from the top. The second electronic component 202 and the first electronic component 201e are arranged in the second direction D22, the third electronic component 203 and the first electronic component 201e are arranged in the second direction D22, and the seventh electronic component 207 and the first electronic component 201e are arranged in the second direction D22. The fourth electronic component 204 is positioned on the opposite side of the second electronic component 202, the third electronic component 203, and the seventh electronic component 207 from the first electronic component 201e side in the second direction D22. That is, the second electronic component 202, the third electronic component 203, and the seventh electronic component 207 are positioned between the first electronic component 201e and the fourth electronic component 204 in the second direction D22. The fourth electronic component 204 and the fifth electronic component 205 are arranged in the first direction D21.

3. Connection Example

The first input-output terminal 101 of the first filter 111 and the selection terminal 131 of the first switch 13 are connected to each other by the first wiring pattern portion 441. The first input-output terminal 103 of the second filter 112 and the selection terminal 141 of the second switch 14 are connected to each other by the second wiring pattern portion 442. The first input-output terminal 105 of the third filter 121 and the selection terminal 132 of the first switch 13 are connected to each other by the third wiring pattern portion 443. The first input-output terminal 107 of the fourth filter 122 and the selection terminal 142 of the second switch 14 are connected to each other by the fourth wiring pattern portion 444. The first input-output terminal 118 of the seventh filter 113 and the selection terminal 191 of the fourth switch 19 are connected to each other by the fifth wiring pattern portion 445. The first input-output terminal 120 of the eighth filter 123 and the selection terminal 192 of the fourth switch 19 are connected to each other by the sixth wiring pattern portion 446.

Figure 11:
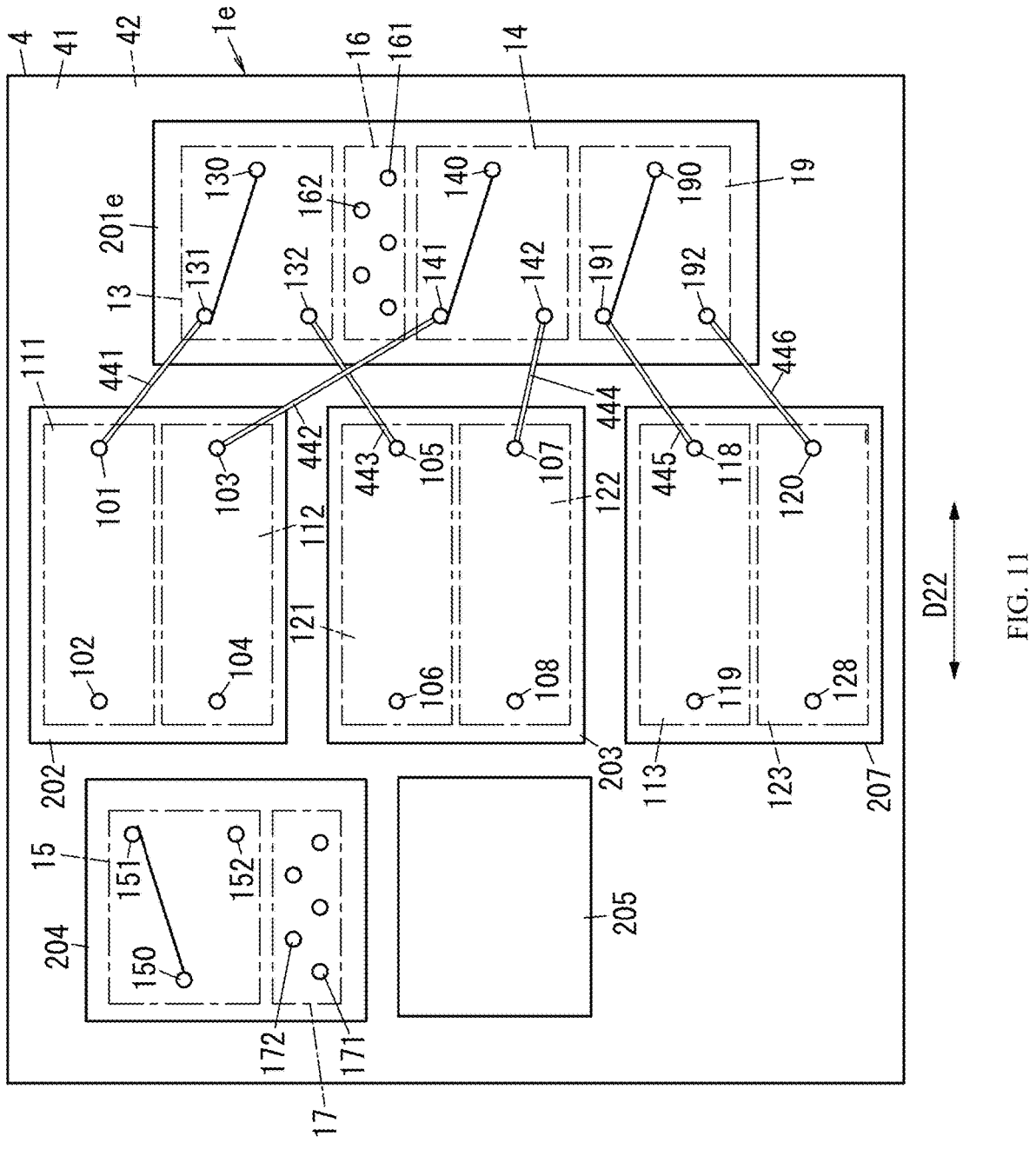
FIG. 11 is a schematic diagram illustrating an example of connection between electronic components regarding the radio frequency module according to the fourth embodiment.

In this case, in the example illustrated in FIG. 11, the common terminal 130 and the selection terminal 131 of the first switch 13 are connected to each other, the common terminal 140 and the selection terminal 141 of the second switch 14 are connected to each other, and the common terminal 190 and the selection terminal 191 of the fourth switch 19 are connected to each other. Thus, in the example illustrated in FIG. 11, the first wiring pattern 441, the second wiring pattern portion 442, and the fifth wiring pattern portion 445 are in the active states. That is, in the example illustrated in FIG. 11, a plurality of signals through simultaneous communication pass through the first wiring pattern portion 441, the second wiring pattern portion 442, and the fifth wiring pattern portion 445. The first wiring pattern portion 441 and the second wiring pattern portion 442 do not intersect each other, the first wiring pattern portion 441 and the fifth wiring pattern portion 445 do not intersect each other, and the second wiring pattern portion 442 and the fifth wiring pattern portion 445 do not intersect each other. The third wiring pattern portion 443 intersects the second wiring pattern portion 442 but does not intersect the first wiring pattern portion 441 or the fifth wiring pattern portion 445. Each of the fourth wiring pattern portion 444 and the sixth wiring pattern portion 446 does not intersect any of the first wiring pattern portion 441, the second wiring pattern portion 442, and the fifth wiring pattern portion 445.

4. Effects

In the radio frequency module 1e according to the fourth embodiment, similarly to as in the radio frequency module 1 according to the first embodiment, the control circuit 16 is positioned between the first switch 13 and the second switch 14 in the first electronic component 201e, which is a single electronic component. Thus, it becomes possible to physically space the first switch 13 and the second switch 14 apart from each other, so that a reduction in the degree of isolation between the first switch 13 and the second switch 14 can be suppressed. This can suppress entry of a signal from the first switch 13 into the second switch 14 and entry of a signal from the second switch 14 into the first switch 13. As a result, the degree of isolation between signals can be improved.

Moreover, in the radio frequency module 1e according to the fourth embodiment, the first wiring pattern portion 441 and the second wiring pattern portion 442, which are both in the active states, do not intersect each other. Furthermore, there is not a wiring pattern portion that intersects the first wiring pattern portion 441 and the second wiring pattern portion 442. Thus, a reduction in the degree of isolation between the first switch 13 and the second switch 14 can further be suppressed.

Furthermore, in the radio frequency module 1e according to the fourth embodiment, the first wiring pattern portion 441 and the fifth wiring pattern portion 445, which are both in the active states, do not intersect each other. Furthermore, there is not a wiring pattern portion that intersects the first wiring pattern portion 441 and the fifth wiring pattern portion 445. Thus, a reduction in the degree of isolation between the first switch 13 and the fourth switch 19 can also be suppressed.

Furthermore, in the radio frequency module 1e according to the fourth embodiment, the second wiring pattern portion 442 and the fifth wiring pattern portion 445, which are both in the active states, do not intersect each other. Furthermore, there is not a wiring pattern portion that intersects the second wiring pattern portion 442 and the fifth wiring pattern portion 445. Thus, a reduction in the degree of isolation between the second switch 14 and the fourth switch 19 can also be suppressed.

In the radio frequency module 1e according to the fourth embodiment, the control circuit 16 controls the first switch 13, the second switch 14, and the fourth switch 19; however, for example, a control circuit that controls the fourth switch 19 may be provided in addition to the control circuit 16. In this case, the above-described control circuit is preferably arranged between the second switch 14 and the fourth switch 19. This can suppress a reduction in the degree of isolation between the second switch 14 and the fourth switch 19.

Fifth Embodiment

A radio frequency module 1f according to the fifth embodiment will be described with reference to FIGS. 12 to

15. Regarding the radio frequency module 1f according to the fifth embodiment, configurations substantially the same as those of the radio frequency module 1 according to the first embodiment (see FIGS. 1 to 3) will be denoted by the same reference symbols, and description will be omitted.

Figure 12:
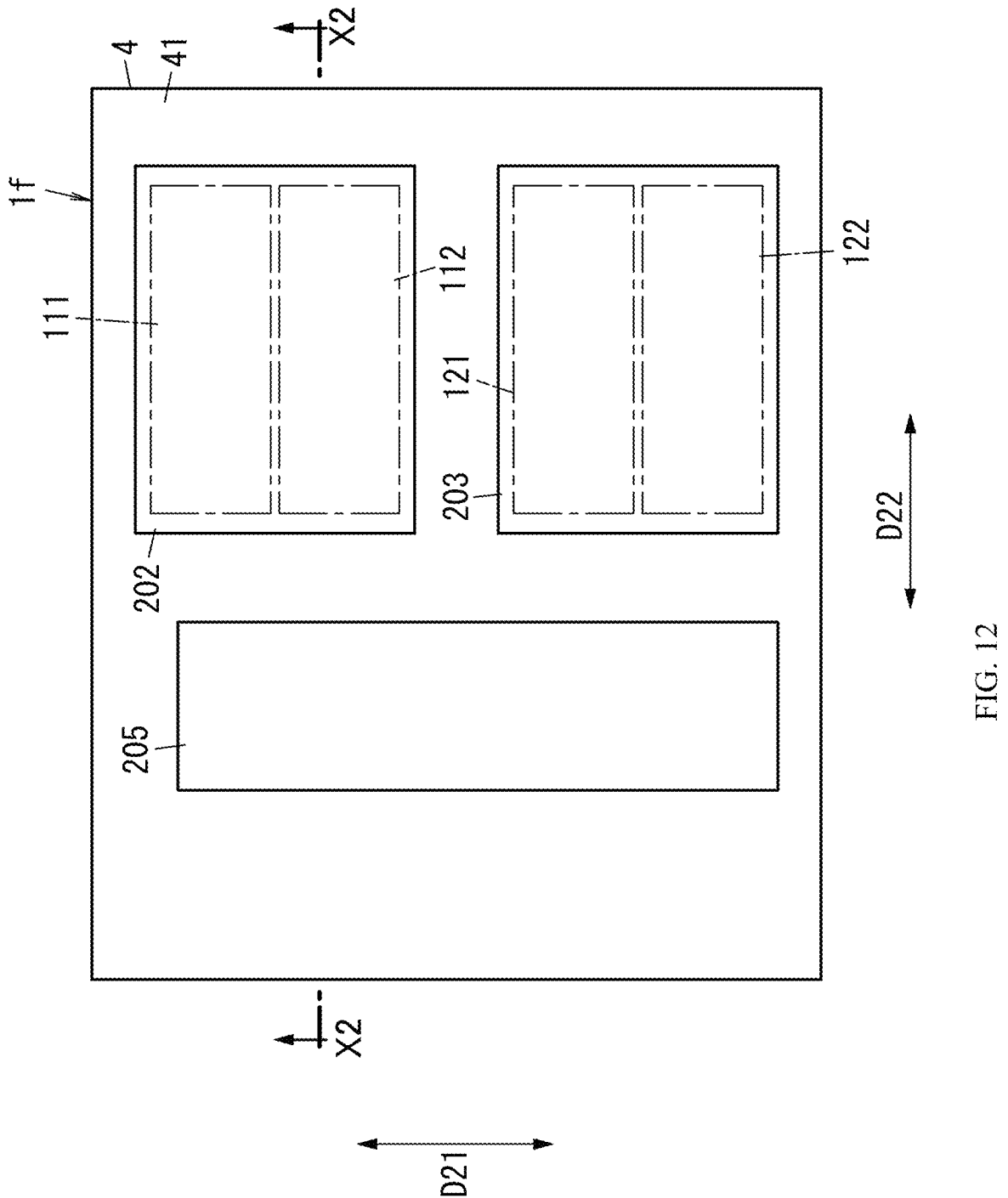
FIG. 12 is a plan view of a radio frequency module according to a fifth embodiment.
Figure 13:
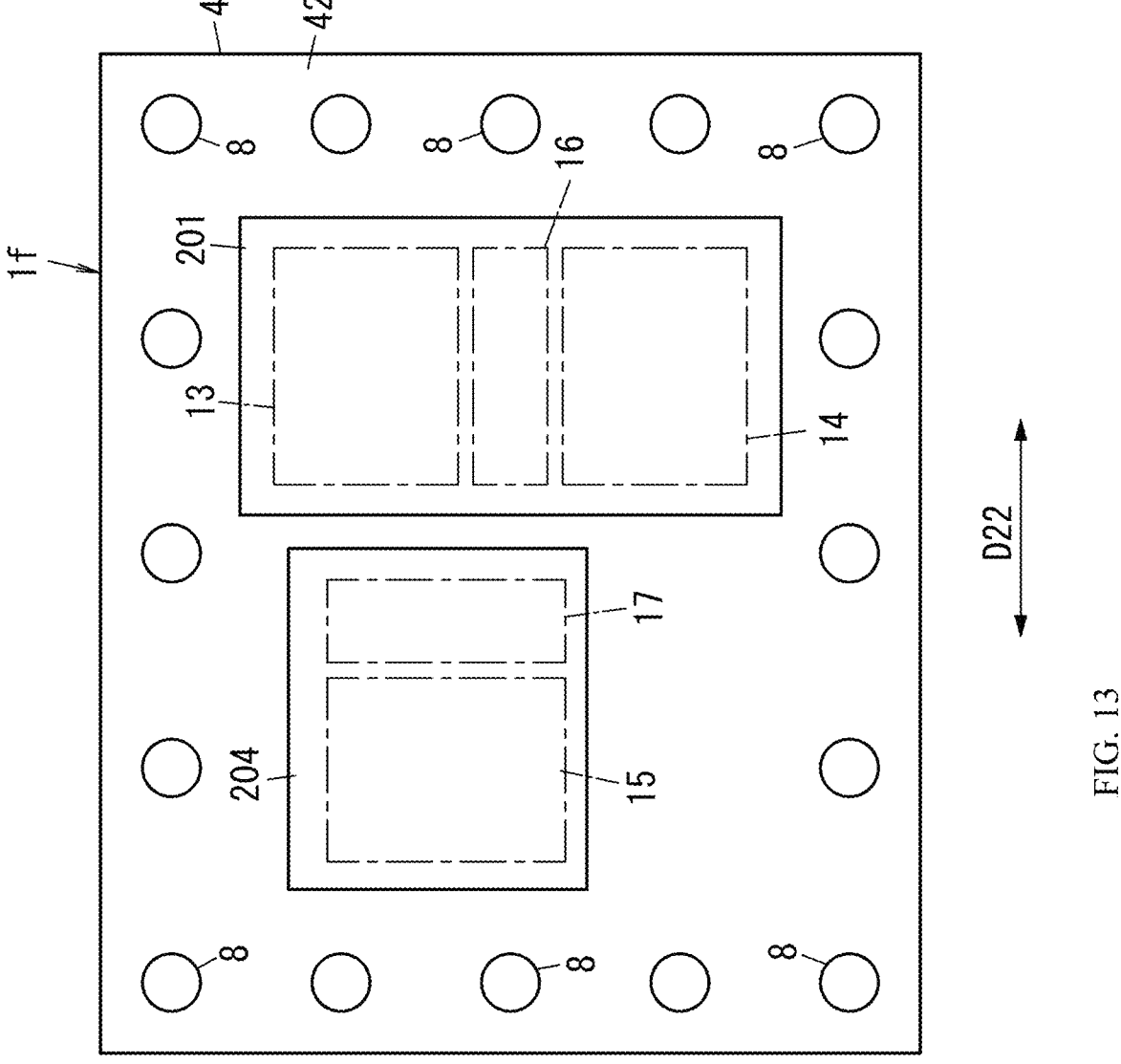
FIG. 13 is a plan view of the radio frequency module according to the fifth embodiment, the plan view being a view of a second main surface of a mounting substrate and electronic components and a plurality of external connection terminals arranged on the second main surface of the mounting substrate, the view being taken in a see-through manner from a first main surface side of the mounting substrate.
Figure 14:
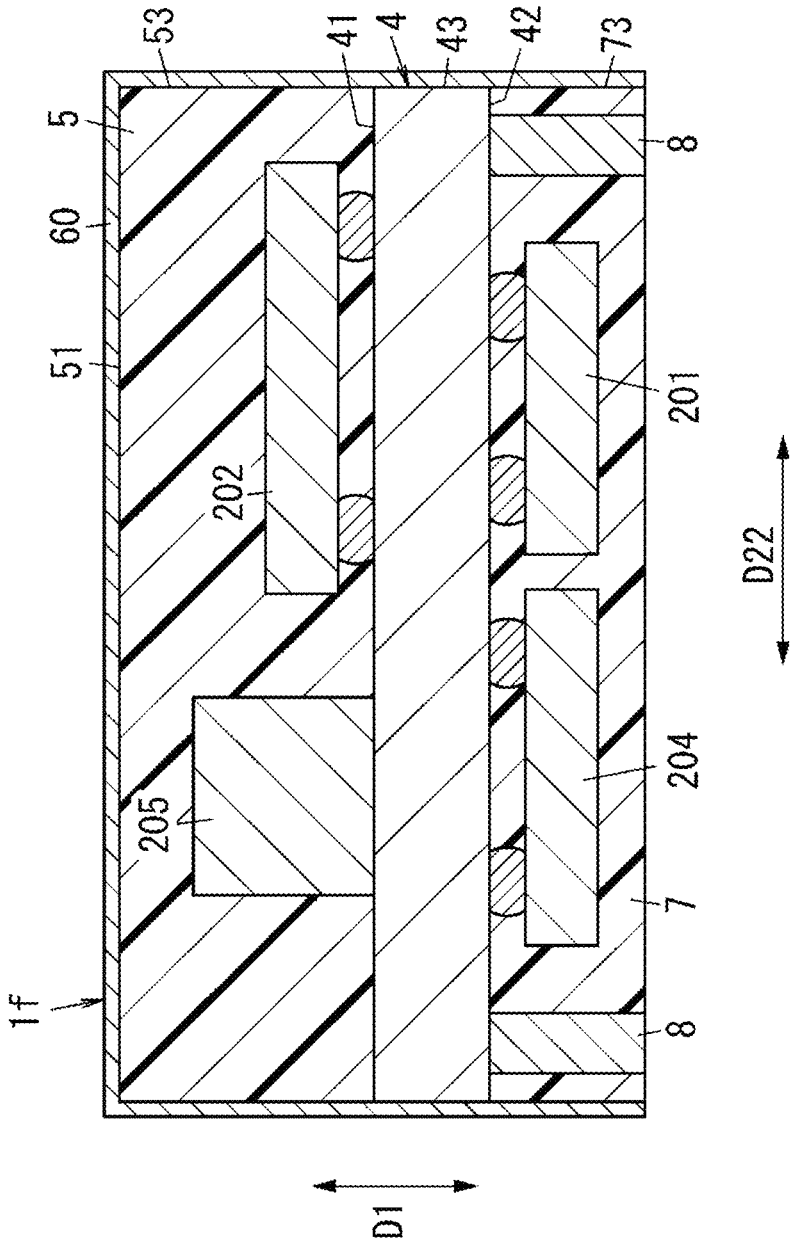
FIG. 14 is a cross-sectional view of the radio frequency module according to the fifth embodiment, the view being taken along line X2-X2 illustrated in FIG. 12.

The radio frequency module 1f according to the fifth embodiment is different from the radio frequency module 1 according to the first embodiment in that, as illustrated in FIGS. 12 to 14, the first electronic component 201 and the fourth electronic component 204 are arranged on the second main surface 42 of the mounting substrate 4. That is, in the radio frequency module 1f according to the fifth embodiment, the electronic components are arranged on both of the first main surface 41 and the second main surface 42 of the mounting substrate 4.

1. Configuration

The radio frequency module 1f according to the fifth embodiment includes, as illustrated in FIGS. 12 to 14, the mounting substrate 4, the first electronic component 201, the second electronic component 202, the third electronic component 203, the fourth electronic component 204, and the fifth electronic component 205. The radio frequency module 1f according to the fifth embodiment further includes the resin layer 5 (hereinafter also referred to as a "first resin layer 5"), the metal electrode layer 60, a second resin layer 7, and the plurality of external connection terminals 8. A material of the plurality of external connection terminals 8 is, for example, metal (for example, copper, a copper alloy, or the like). Each of the plurality of external connection terminals 8 is a cylindrical electrode. In a plan view from the thickness direction D1 of the mounting substrate 4, each of the plurality of external connection terminals 8 has a circular shape.

As illustrated in FIG. 14, the first resin layer 5 is arranged on the first main surface 41 of the mounting substrate 4. The first resin layer 5 covers the second electronic component 202, the third electronic component 203, and the fifth electronic component 205. In more detail, the first resin layer 5 covers the outer peripheral surfaces and main surfaces of the second electronic component 202, the third electronic component 203, and the fifth electronic component 205, the main surfaces being on the opposite side from the mounting substrate 4 side. The first resin layer 5 contains a resin (for example, epoxy resin). The first resin layer 5 may contain a filler in addition to the resin.

As illustrated in FIG. 14, the second resin layer 7 is arranged on the second main surface 42 of the mounting substrate 4. The second resin layer 7 covers the first electronic component 201 and the fourth electronic component 204. In more detail, the second resin layer 7 covers the outer peripheral surfaces and main surfaces of the first electronic component 201 and the fourth electronic component 204, the main surfaces being on the opposite side from the mounting substrate 4 side. The second resin layer 7 contains a resin (for example, epoxy resin). The second resin layer 7 may contain a filler in addition to the resin. The material of the second resin layer 7 may be the same as or different from that of the first resin layer 5.

The second resin layer 7 may also be formed such that the main surfaces of the first electronic component 201 and the fourth electronic component 204 arranged on the second main surface 42 of the mounting substrate 4 are exposed, the main surfaces being on the opposite side from the mounting substrate 4 side.

2. Layout

In the radio frequency module 1*f* according to the fifth embodiment, as illustrated in FIGS. 12 and 14, the second electronic component 202, the third electronic component 203, and the fifth electronic component 205 are arranged on the first main surface 41 of the mounting substrate 4. The second electronic component 202 includes the first filter 111 and the second filter 112. The third electronic component 203 includes the third filter 121 and the fourth filter 122. The second electronic component 202 and the third electronic component 203 are arranged in the first direction D21. The second electronic component 202 and the fifth electronic component 205 are arranged in the second direction D22, and the third electronic component 203 and the fifth electronic component 205 are arranged in the second direction D22.

In the radio frequency module 1*f* according to the fifth embodiment, as illustrated in FIGS. 13 and 14, the first electronic component 201 and the fourth electronic component 204 are arranged on the second main surface 42 of the mounting substrate 4. The first electronic component 201 includes the first switch 13, the second switch 14, and the control circuit 16, which controls the first switch 13 and the second switch 14. In the first electronic component 201, the control circuit 16 is positioned between the first switch 13 and the second switch 14. That is, in the first electronic component 201, the first switch 13, the control circuit 16, and the second switch 14 are arranged in this order from the top in the first direction D21. The fourth electronic component 204 includes the third switch 15 and the control circuit 17, which controls the third switch 15. The first electronic component 201 and the fourth electronic component 204 are arranged in the second direction D22.

3. Connection Example

The first input-output terminal 101 of the first filter 111 and the selection terminal 131 of the first switch 13 are connected to each other by the first wiring pattern portion 441. The first input-output terminal 103 of the second filter 112 and the selection terminal 141 of the second switch 14 are connected to each other by the second wiring pattern portion 442. The first input-output terminal 105 of the third filter 121 and the selection terminal 132 of the first switch 13 are connected to each other by the third wiring pattern portion 443. The first input-output terminal 107 of the fourth filter 122 and the selection terminal 142 of the second switch 14 are connected to each other by the fourth wiring pattern portion 444.

Figure 15:
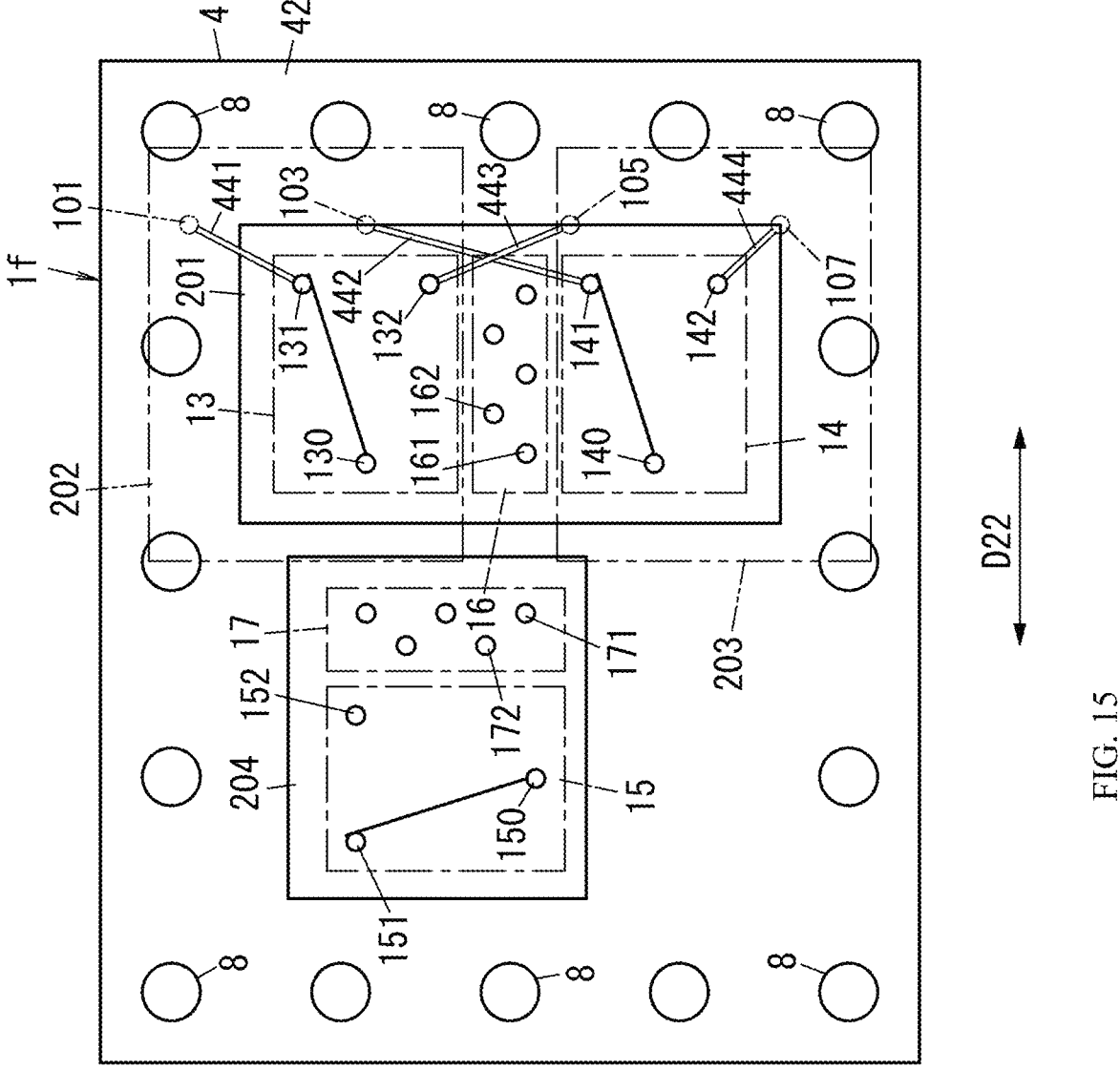
FIG. 15 is a schematic diagram illustrating an example of connection between electronic components regarding the radio frequency module according to the fifth embodiment.

In this case, in the example illustrated in FIG. 15, the common terminal 130 and the selection terminal 131 of the first switch 13 are connected to each other, and the common terminal 140 and the selection terminal 141 of the second switch 14 are connected to each other. Thus, in the example illustrated in FIG. 15, the first wiring pattern portion 441 and the second wiring pattern portion 442 are in the active states. That is, in the example illustrated in FIG. 15, a plurality of signals through simultaneous communication pass through the first wiring pattern portion 441 and the second wiring pattern portion 442. The first wiring pattern portion 441 and the second wiring pattern portion 442 do not intersect each other. The third wiring pattern portion 443 intersects the second wiring pattern portion 442 but does not intersect the first wiring pattern portion 441. The fourth wiring pattern portion 444 does not intersect either of the first wiring pattern portion 441 and the second wiring pattern portion 442.

Moreover, in the radio frequency module 1*f* according to the fifth embodiment, as illustrated in FIG. 15, in a plan view from the thickness direction D1 of the mounting substrate 4, part of the first electronic component 201 and part of the second electronic component 202 overlap each other. Note that, in a plan view from the thickness direction D1 of the mounting substrate 4, the entirety of the first electronic component 201 and part of the second electronic component 202 may overlap each other, part of the first electronic component 201 and the entirety of the second electronic component 202 may overlap each other, or the entirety of the first electronic component 201 and the entirety of the second electronic component 202 may overlap each other. In short, "in a plan view from the thickness direction D1 of the mounting substrate 4, the first electronic component 201 and the second electronic component 202 overlap each other" refers to, in a plan view from the thickness direction D1 of the mounting substrate 4, at least part of the first electronic component 201 and at least part of the second electronic component 202 overlapping each other.

Moreover, in the radio frequency module 1*f* according to the fifth embodiment, as illustrated in FIG. 15, in a plan view from the thickness direction D1 of the mounting substrate 4, part of the fourth electronic component 204 and part of the second electronic component 202 overlap each other. Note that, in a plan view from the thickness direction D1 of the mounting substrate 4, the entirety of the fourth electronic component 204 and part of the second electronic component 202 may overlap each other, part of the fourth electronic component 204 and the entirety of the second electronic component 202 may overlap each other, or the entirety of the fourth electronic component 204 and the entirety of the second electronic component 202 may overlap each other. In short, "in a plan view from the thickness direction D1 of the mounting substrate 4, the fourth electronic component 204 and the second electronic component 202 overlap each other" refers to, in a plan view from the thickness direction D1 of the mounting substrate 4, at least part of the fourth electronic component 204 and at least part of the second electronic component 202 overlapping each other.

Moreover, in the radio frequency module 1*f* according to the fifth embodiment, as illustrated in FIG. 15, in a plan view from the thickness direction D1 of the mounting substrate 4, part of the first electronic component 201 and part of the third electronic component 203 overlap each other. Note that, in a plan view from the thickness direction D1 of the mounting substrate 4, the entirety of the first electronic component 201 and part of the third electronic component 203 may overlap each other, part of the first electronic component 201 and the entirety of the third electronic component 203 may overlap each other, or the entirety of the first electronic component 201 and the entirety of the third electronic component 203 may overlap each other. In short, "in a plan view from the thickness direction D1 of the mounting substrate 4, the first electronic component 201 and the third electronic component 203 overlap each other" refers to, in a plan view from the thickness direction D1 of the mounting substrate 1, at least part of the first electronic component 201 and at least part of the third electronic component 203 overlapping each other.

Moreover, in the radio frequency module 1*f* according to the fifth embodiment, as illustrated in FIG. 15, in a plan view from the thickness direction D1 of the mounting substrate 4, part of the fourth electronic component 204 and part of the third electronic component 203 overlap each other. Note that, in a plan view from the thickness direction D1 of the mounting substrate 4, the entirety of the fourth electronic component 204 and part of the third electronic component 203 may overlap each other, part of the fourth electronic component 204 and the entirety of the third electronic component 203 may overlap each other, or the entirety of the fourth electronic component 204 and the entirety of the third electronic component 203 may overlap each other. In short, "in a plan view from the thickness direction D1 of the mounting substrate 4, the fourth electronic component 204 and the third electronic component 203 overlap each other" refers to, in a plan view from the thickness direction D1 of the mounting substrate 4, at least part of the fourth electronic component 204 and at least part of the third electronic component 203 overlapping each other.

4. Effects

In the radio frequency module 1*f* according to the fifth embodiment, similarly to as in the radio frequency module 1 according to the first embodiment, the control circuit 16 is positioned between the first switch 13 and the second switch 14 in the first electronic component 201, which is a single electronic component. Thus, it becomes possible to physically space the first switch 13 and the second switch 14 apart from each other, so that a reduction in the degree of isolation between the first switch 13 and the second switch 14 can be suppressed. This can suppress entry of a signal from the first switch 13 into the second switch 14 and entry of a signal from the second switch 14 into the first switch 13. As a result, the degree of isolation between signals can be improved.

Moreover, in the radio frequency module 1*f* according to the fifth embodiment, the first wiring pattern portion 441 and the second wiring pattern portion 442, which are in the active states, do not intersect each other. Furthermore, there is not a wiring pattern portion that intersects both of the first wiring pattern portion 441 and the second wiring pattern portion 442. Thus, a reduction in the degree of isolation between the first switch 13 and the second switch 14 can further be suppressed.

Moreover, in the radio frequency module 1*f* according to the fifth embodiment, in a plan view from the thickness direction D1 of the mounting substrate 4, the second electronic component 202 and the first electronic component 201 overlap each other, and the third electronic component 203 and the first electronic component 201 overlap each other. As a result, a wiring length between the first electronic component 201 and the second electronic component 202 and a wiring length between the first electronic component 201 and the third electronic component 203 can be reduced, so that signal loss due to a wiring length can be reduced.

Moreover, in the radio frequency module 1*f* according to the fifth embodiment, in a plan view from the thickness direction D1 of the mounting substrate 4, the second electronic component 202 and the fourth electronic component 204 overlap each other, and the third electronic component 203 and the fourth electronic component 204 overlap each other. As a result, a wiring length between the fourth electronic component 204 and the second electronic component 202 and a wiring length between the fourth electronic component 204 and the third electronic component 203 can be reduced, so that signal loss due to a wiring length can be reduced.

5. Modifications

5.1. First Modification

Figure 16:
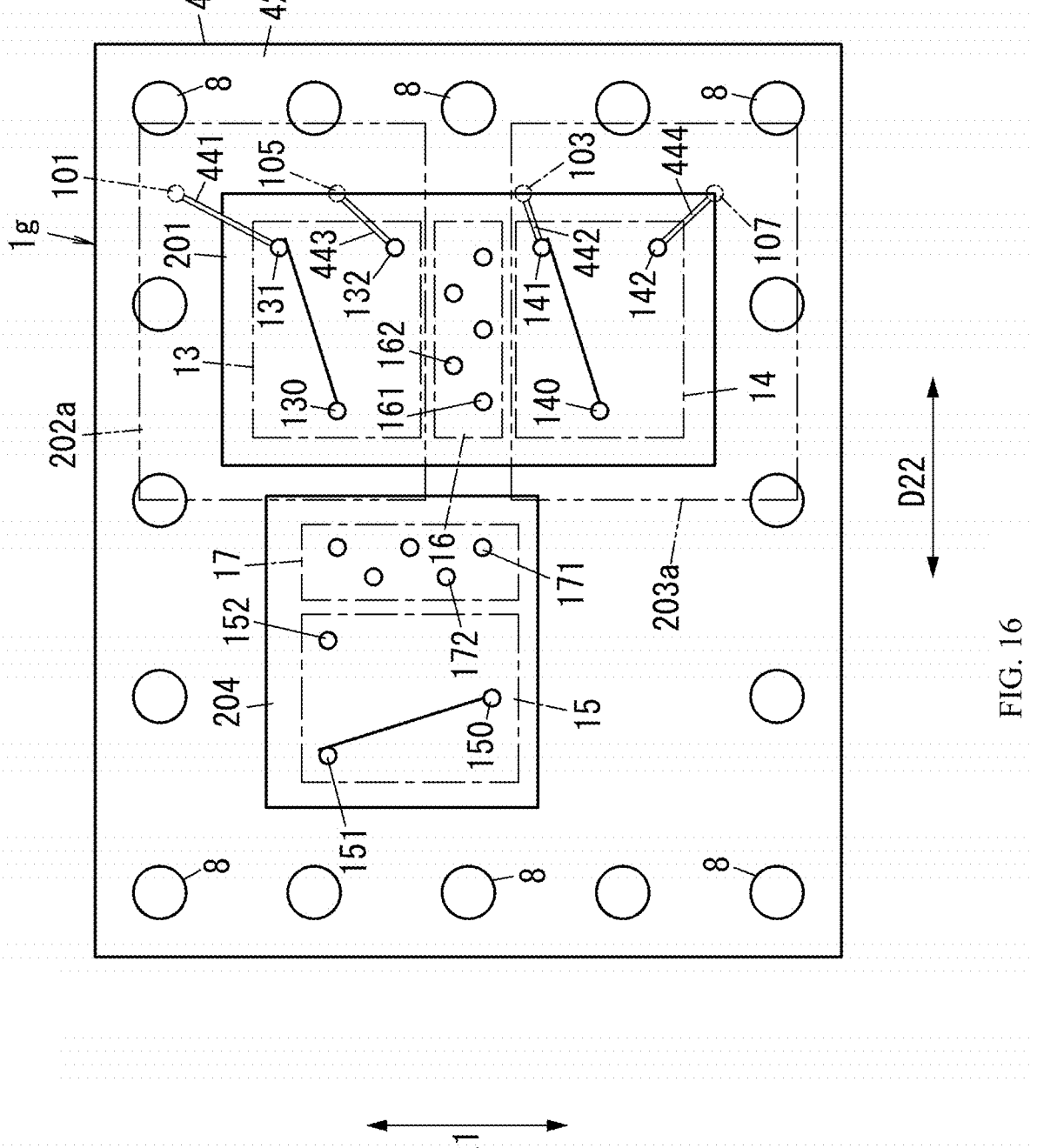
FIG. 16 is a schematic diagram illustrating an example of connection between electronic components regarding a radio frequency module according to a first modification of the fifth embodiment.

In the fifth embodiment, the first filter 111 and the second filter 112 are provided in the second electronic component 202, and the third filter 121 and the fourth filter 122 are provided in the third electronic component 203. In contrast, as illustrated in FIG. 16, the first filter 111 and the third filter 121 may be provided in the second electronic component 202*a*, and the second filter 112 and the fourth filter 122 may be provided in the third electronic component 203*a*. In the following, a radio frequency module 1*g* according to a first modification will be described with reference to FIG. 16. Note that, regarding the radio frequency module 1*g* according to the first modification, configurations substantially the same as those of the radio frequency module 1 according to the first embodiment will be denoted by the same reference symbols, and description will be omitted.

5.1.1. Configuration and Layout

In the radio frequency module 1*g* according to the first modification, the second electronic component 202*a*, the third electronic component 203*a*, and the fifth electronic component 205 (see FIG. 12) are arranged on the first main surface 41 of the mounting substrate 4. In the radio frequency module 1*g* according to the first modification, as illustrated in FIG. 16, the first electronic component 201 and the fourth electronic component 204 are arranged on the second main surface 42 of the mounting substrate 4.

The first electronic component 201 includes the first switch 13, the second switch 14, and the control circuit 16, which controls the first switch 13 and the second switch 14. In the first electronic component 201, the control circuit 16 is positioned between the first switch 13 and the second switch 14. That is, in the first electronic component 201, the first switch 13, the control circuit 16, and the second switch 14 are arranged in this order from the top in the first direction D21.

The second electronic component 202*a* includes the first filter 111 and the third filter 121. The third electronic component 203*a* includes the second filter 112 and the fourth filter 122. The fourth electronic component 204 includes the third switch 15 and the control circuit 17, which controls the third switch 15.

5.1.2. Connection Example

The first input-output terminal 101 of the first filter 111 and the selection terminal 131 of the first switch 13 are connected to each other by the first wiring pattern portion 441. The first input-output terminal 103 of the second filter 112 and the selection terminal 141 of the second switch 14 are connected to each other by the second wiring pattern portion 442. The first input-output terminal 105 of the third filter 121 and the selection terminal 132 of the first switch 13 are connected to each other by the third wiring pattern portion 443. The first input-output terminal 107 of the fourth filter 122 and the selection terminal 142 of the second switch 14 are connected to each other by the fourth wiring pattern portion 444.

In this case, in the example illustrated in FIG. 16, the common terminal 130 and the selection terminal 131 of the first switch 13 are connected to each other, and the common terminal 140 and the selection terminal 141 of the second switch 14 are connected to each other. Thus, in the example illustrated in FIG. 16, the first wiring pattern portion 441 and the second wiring pattern portion 442 are in the active states. That is, in the example illustrated in FIG. 16, a plurality of signals through simultaneous communication pass through the first wiring pattern portion 441 and the second wiring pattern portion 442. The first wiring pattern portion 441 and the second wiring pattern portion 442 do not intersect each other. Each of the third wiring pattern portion 443 and the fourth wiring pattern portion 444 does not intersect either of the first wiring pattern portion 441 and the second wiring pattern portion 442.

Moreover, in the radio frequency module 1g according to the first modification, as illustrated in FIG. 16, in a plan view from the thickness direction D1 of the mounting substrate 4, part of the first electronic component 201 and part of the second electronic component 202 overlap each other. Moreover, in the radio frequency module 1g according to the first modification, as illustrated in FIG. 16, in a plan view from the thickness direction D1 of the mounting substrate 4, part of the fourth electronic component 204 and part of the second electronic component 202 overlap each other. Moreover, in the radio frequency module 1g according to the first modification, as illustrated in FIG. 16, in a plan view from the thickness direction D1 of the mounting substrate 4, part of the first electronic component 201 and part of the third electronic component 203 overlap each other. Moreover, in the radio frequency module 1g according to the first modification, as illustrated in FIG. 16, in a plan view from the thickness direction D1 of the mounting substrate 4, part of the fourth electronic component 204 and part of the third electronic component 203 overlap each other.

5.1.3. Effects

In the radio frequency module 1g according to the first modification, similarly to as in the radio frequency module 1f according to the fifth embodiment, the control circuit 16 is positioned between the first switch 13 and the second switch 14 in the first electronic component 201, which is a single electronic component. Thus, it becomes possible to physically space the first switch 13 and the second switch 14 apart from each other, so that a reduction in the degree of isolation between the first switch 13 and the second switch 14 can be suppressed. This can suppress entry of a signal from the first switch 13 into the second switch 14 and entry of a signal from the second switch 14 into the first switch 13. As a result, the degree of isolation between signals can be improved.

Moreover, in the radio frequency module 1g according to the first modification, the first wiring pattern portion 441 and the second wiring pattern portion 442, which are in the active states, do not intersect each other. Furthermore, there is not a wiring pattern portion that intersects both of the first wiring pattern portion 441 and the second wiring pattern portion 442. Thus, a reduction in the degree of isolation between the first switch 13 and the second switch 14 can further be suppressed.

Moreover, in the radio frequency module 1g according to the first modification, in a plan view from the thickness direction D1 of the mounting substrate 4, the second electronic component 202 and the first electronic component 201 overlap each other, and the third electronic component 203 and the first electronic component 201 overlap each other. As a result, a wiring length between the first electronic component 201 and the second electronic component 202 and a wiring length between the first electronic component

201 and the third electronic component 203 can be reduced, so that signal loss due to a wiring length can be reduced.

Moreover, in the radio frequency module 1g according to the first modification, in a plan view from the thickness direction D1 of the mounting substrate 4, the second electronic component 202 and the fourth electronic component 204 overlap each other, and the third electronic component 203 and the fourth electronic component 204 overlap each other. As a result, a wiring length between the fourth electronic component 204 and the second electronic component 202 and a wiring length between the fourth electronic component 204 and the third electronic component 203 can be reduced, so that signal loss due to a wiring length can be reduced.

5.2. Second Modification

Figure 17:
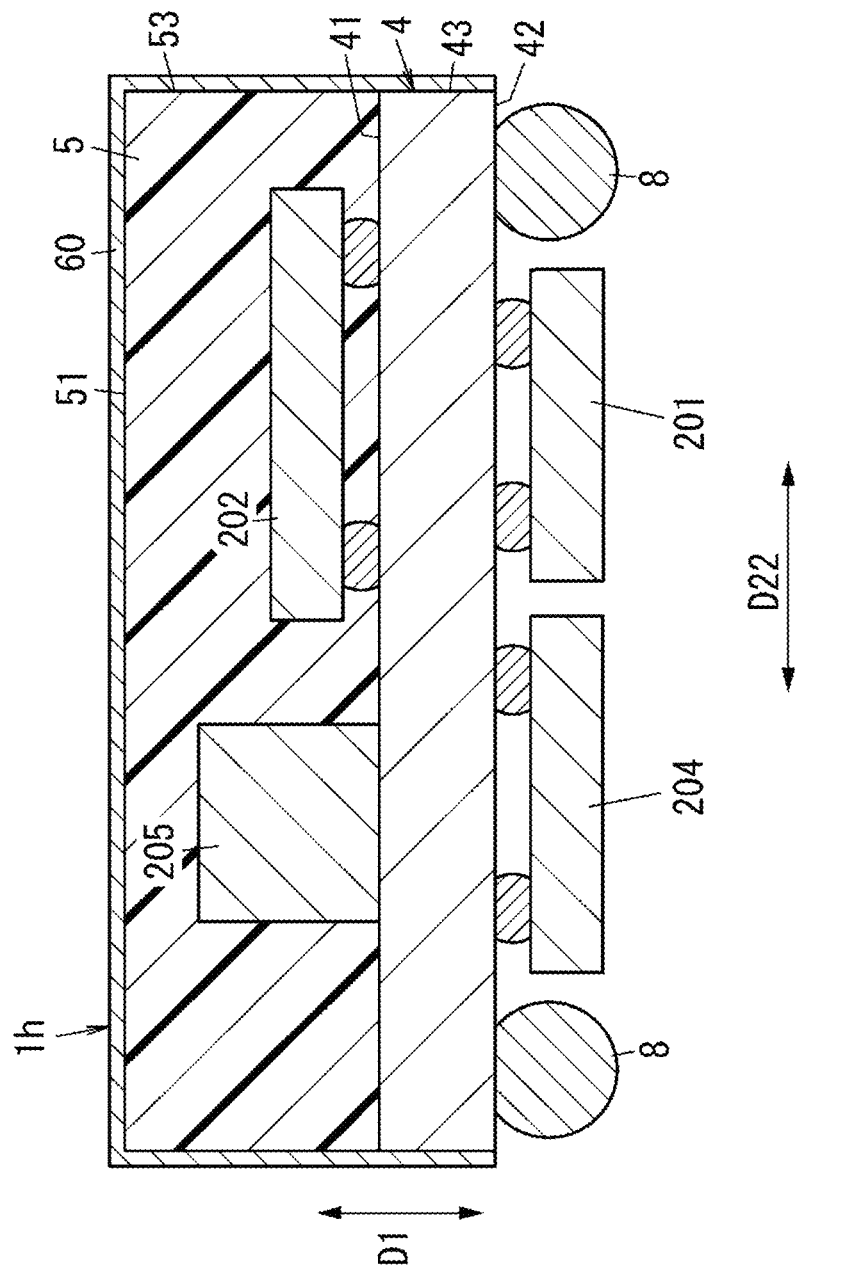
FIG. 17 is a cross-sectional view of a radio frequency module according to a second modification of the fifth embodiment.

In the following, a radio frequency module 1h according to a second modification will be described with reference to FIG. 17. Note that, regarding the radio frequency module 1h according to the second modification, configurations substantially the same as those of the radio frequency module 1f according to the fifth embodiment will be denoted by the same reference symbols, and description will be omitted.

The radio frequency module 1h according to the second modification is different from the radio frequency module 1f according to the fifth embodiment in that the plurality of external connection terminals 8 are ball bumps. Moreover, the radio frequency module 1h according to the second modification is different from the radio frequency module 1f according to the fifth embodiment in that the radio frequency module 1h according to the second modification does not have the second resin layer 7 according to the fifth embodiment. The radio frequency module 1h according to the second modification may include underfill portions provided in the gaps between the second main surface 42 of the mounting substrate 4 and each of the first electronic component 201 and the fourth electronic component 204 mounted on the second main surface 42 of the mounting substrate 4.

A ball pump material of each of the plurality of external connection terminals 8 is, for example, gold, copper, solder, or the like.

The plurality of external connection terminals 8 may include, in a mixed manner, external connection terminals 8 formed by ball pumps and external connection terminals 8 formed by cylindrical electrodes.

The radio frequency module 1h according to the second modification provides substantially the same effects as the radio frequency module 1f according to the fifth embodiment.

Sixth Embodiment

A radio frequency module 1i according to the sixth embodiment will be described with reference to FIGS. 18 and 19. Regarding the radio frequency module 1i according to the sixth embodiment, configurations substantially the same as those of the radio frequency module 1 according to the first embodiment (see FIG. 3) will be denoted by the same reference symbols, and description will be omitted.

The radio frequency module 1i according to the sixth embodiment is different from the radio frequency module 1 according to the first embodiment in that a second filter 112i is a hybrid filter. Moreover, the radio frequency module 1i according to the sixth embodiment is different from the radio frequency module 1 according to the first embodiment in that the radio frequency module 1*i* according to the sixth embodiment includes a duplexer 45.

1. Configuration

Figure 18:
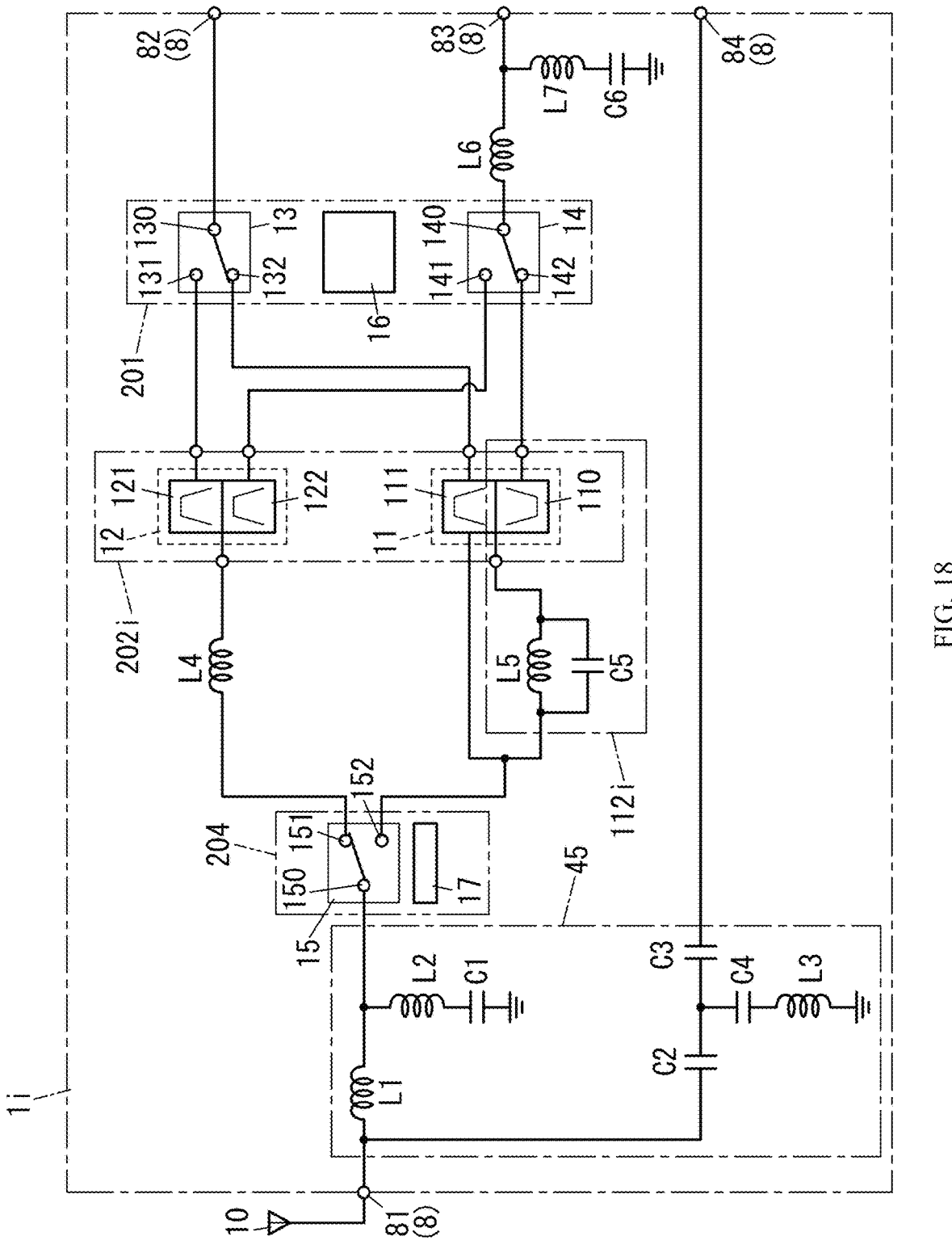
FIG. 18 is a circuit configuration diagram of a radio frequency module according to a sixth embodiment.
Figure 19:
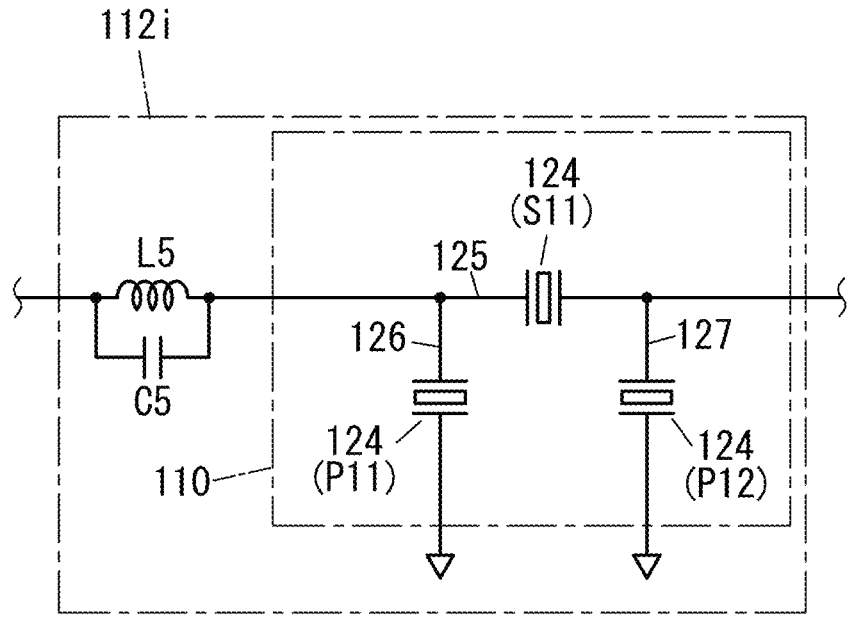
FIG. 19 is a circuit diagram of a main portion of the radio frequency module according to the sixth embodiment.

The radio frequency module 1*i* according to the sixth embodiment includes, as illustrated in FIG. 18, the plurality of multiplexers 11 and 12 (two multiplexers in the illustrated example), the first switch 13, the second switch 14, the third switch 15, the plurality of control circuits 16 and 17 (two control circuits in the illustrated example). The radio frequency module 1*i* according to the sixth embodiment further includes the plurality of external connection terminals 8 (four external connection terminals in the illustrated example). Moreover, the radio frequency module 1*i* according to the sixth embodiment further includes the duplexer 45. The multiplexer 11 includes the first filter 111 and an acoustic wave filter 110, which is part of the second filter 112*i*.

As illustrated in FIG. 18, the second filter 112*i* is a hybrid filter including the acoustic wave filter 110, an inductor L5, and a capacitor C5. The acoustic wave filter 110 has, as illustrated in FIG. 19, at least one acoustic wave resonator 124 (three acoustic wave resonators in the illustrated example).

The acoustic wave filter 110 is, for example, a n filter. The acoustic wave filter 110 has three acoustic wave resonators 124. The three acoustic wave resonators 124 include one series arm resonator S11 and two parallel arm resonators P11 and P12. The series arm resonator S11 is provided on a series arm path 125, which connects the selection terminal 142 of the second switch 14 and the selection terminal 152 of the third switch 15 to each other. The parallel arm resonator P11 is provided on a parallel arm path 126, which connects the path between the selection terminal 152 of the third switch 15 and the series arm resonator S11 and ground to each other, the path being included in the series arm path 125. The parallel arm resonator P12 is provided on a parallel arm path 127, which connects the path between the selection terminal 152 of the third switch 15 and the series arm resonator S11 and ground to each other, the path being included in the series arm path 125.

As illustrated in FIG. 18, the inductor L5 is connected between the selection terminal 153 of the third switch 15 and the second filter 112. In more detail, the inductor L5 is connected in series with the second filter 112. The capacitor C5 is connected in parallel with the inductor L5, which is connected in series with the second filter 112. That is, the "hybrid filter" is a filter including an acoustic wave filter having at least one acoustic wave resonator, at least one capacitor, and at least one inductor. The pass band width of the hybrid filter is wider than that of the at least one acoustic wave resonator 124 of the acoustic wave filter 110.

The duplexer 45 includes, as illustrated in FIG. 18, a plurality of inductors L1 to L3 (three inductors in the illustrated example) and a plurality of capacitors C1 to C4 (four capacitors in the illustrated example).

The inductor L1 is connected between the antenna terminal 81 and the common terminal 150 of the third switch 15. A series circuit formed by the inductor L2 and the capacitor C1 is connected between a connection point where the inductor L1 and the common terminal 150 of the third switch 15 are connected to each other and ground. A series circuit formed by the two capacitors C2 and C3 is connected between a connection point where the inductor L1 and the antenna terminal 81 are connected to each other and the third signal terminal 84. A series circuit formed by the capacitor C4 and the inductor L3 is connected between a connection point where the two capacitors C2 and C3 are connected to each other and ground.

In the radio frequency module 1*i* according to the sixth embodiment, an inductor L4 is connected between the selection terminal 151 of the third switch 15 and the third and fourth filters 121 and 122. In the radio frequency module 1*i* according to the sixth embodiment, an inductor L6 is connected between the common terminal 140 of the second switch 14 and the second signal terminal 83. Moreover, in the radio frequency module 1*i* according to the sixth embodiment, a series circuit formed by an inductor L7 and a capacitor C6 is connected between a connection point where the inductor L6 and the second signal terminal 83 are connected to each other and ground.

In this case, the first filter 111 is, for example, a transmission-reception filter that allows transmission signals and reception signals of the first communication band to pass therethrough. The first communication band is, for example, channels 1 to 13 in the 2.4 GHz band (2400 MHz to 2483 MHz) for WiFi®. The second filter 112*i* is, for example, a transmission-reception filter that attenuates transmission signals and reception signals of the first communication band and also allows transmission signals and reception signals of the second communication band to pass therethrough. The second communication band is, for example, Band 41 (2496 MHz to 2690 MHz) based on the 3GPP LTE standard.

The third filter 121 is, for example, a transmission-reception filter that allows transmission signals and reception signals of the third communication band to pass therethrough. The third communication band is, for example, channels 1 to 6 in the 2.4 GHz band for WiFi®. The fourth filter 122 is, for example, a transmission-reception filter that allows transmission signals and reception signals of the fourth communication band to pass therethrough. The fourth communication band is, for example, Band 53 (2483.5 MHz to 2500 MHz) based on the 3GPP LTE standard.

2. Layout

In the radio frequency module 1*i* according to the sixth embodiment, the first switch 13, the second switch 14, and the control circuit 16, which controls the first switch 13 and the second switch 14, are provided in the first electronic component 201, which is a single electronic component. In more detail, in the first electronic component 201, the control circuit 16 is positioned between the first switch 13 and the second switch 14.

In the radio frequency module 1*i* according to the sixth embodiment, the first filter 111, the acoustic wave filter 110, which is included in the second filter 112*i*, the third filter 121, and the fourth filter 122 are provided in a second electronic component 202*i*, which is a single electronic component. Moreover, in the radio frequency module 1*i* according to the sixth embodiment, the third switch 15 and the control circuit 17, which controls the third switch 15, are provided in the fourth electronic component 204, which is a single electronic component.

3. Effects

In the radio frequency module 1*i* according to the sixth embodiment, the control circuit 16 is positioned between the first switch 13 and the second switch 14 in the first electronic component 201. Thus, in the first electronic component 201, it becomes possible to physically space the first switch 13 and the second switch 14 apart from each other, so that a reduction in the degree of isolation between the first switch 13 and the second switch 14 can be suppressed. This can suppress entry of a signal from the first switch 13 into the second switch 14 and entry of a signal from the second switch 14 into the first switch 13. As a result, the degree of isolation between signals can be improved.

Modifications

In the following, modifications of the first to sixth embodiments will be described.

The radio frequency modules 1, 1a, 1b, 1c, 1d, 1e, 1f, 1g, 1h, and 1i according to the first to sixth embodiments include the metal electrode layer 60; however, the metal electrode layer 60 may be omitted.

Each of the first filter 111, the second filter 112, the third filter 121, the fourth filter 122, the fifth filter 181, the sixth filter 182, the seventh filter 113, and the eighth filter 123 according to the first to sixth embodiments does not have to be a surface acoustic wave filter and may be, for example, a bulk acoustic wave (BAW) filter. A resonator in a BAW filter is, for example, a film bulk acoustic resonator (FBAR) or a solidly mounted resonator (SMR).

Each of the first filter 111, the second filter 112, the third filter 121, the fourth filter 122, the fifth filter 181, the sixth filter 182, the seventh filter 113, and the eighth filter 123 according to the first to sixth embodiments does not have to be a ladder filter and may be, for example, a longitudinally coupled resonator-type surface acoustic wave filter.

The above-described acoustic wave filter is an acoustic wave filter using surface acoustic waves or bulk acoustic waves; however, the above-described acoustic wave filter is not limited to this filter and may be, for example, an acoustic wave filter using boundary acoustic waves, plate waves, or the like.

The communication device 100 according to the first embodiment may include any one of the radio frequency modules 1a, 1b, 1f, 1g, and 1h instead of the radio frequency module 1.

Herein, "elements are arranged on a first main surface of a substrate" includes not only a case where the elements are directly mounted on the first main surface of the substrate but also a case where, out of a space on the first main surface side and a space on the second main surface side, the elements are arranged in the space on the first main surface side, the spaces being separated from each other by the substrate. That is, "elements are arranged on a first main surface of a substrate" includes a case where the elements are mounted on the first main surface of the substrate with, for example, other circuit elements or electrodes interposed therebetween. The elements are, for example, the second electronic component 202, the third electronic component 203, and the fifth electronic component 205; however, the elements are not limited to the second electronic component 202, the third electronic component 203, and the fifth electronic component 205. The substrate is, for example, the mounting substrate 4. In a case where the substrate is the mounting substrate 4, the first main surface is the first main surface 41, and the second main surface is the second main surface 42.

Herein, "elements are arranged on a second main surface of a substrate" includes not only a case where the elements are directly mounted on the second main surface of the substrate but also a case where, out of a space on the first main surface side and a space on the second main surface side, the elements are arranged in the space on the second main surface side, the spaces being separated from each other by the substrate. That is, "elements are arranged on a second main surface of a substrate" includes a case where the elements are mounted on the second main surface of the substrate with, for example, other circuit elements or electrodes interposed therebetween. The elements are, for example, the first electronic component 201 and the fourth electronic component 204; however, the elements are not limited to the first electronic component 201 and the fourth electronic component 204. The substrate is, for example, the mounting substrate 4. In a case where the substrate is the mounting substrate 4, the first main surface is the first main surface 41, and the second main surface is the second main surface 42.

ASPECTS

Herein, the following aspects are disclosed.

A radio frequency module (1; 1a to 1i) according to a first aspect includes a first switch (13; 13d), a second switch (14; 14d), a control circuit (16), a first filter (111), a second filter (112), a third filter (121), a fourth filter (122), and an antenna terminal (81). The first switch (13; 13d) has a first common terminal (130), a first selection terminal (131), and a second selection terminal (132). The second switch (14; 14d) has a second common terminal (140), a third selection terminal (141), and a fourth selection terminal (142). The control circuit (16) controls the first switch (13; 13d) and the second switch (14; 14d). The first filter (111) is connected to the first selection terminal (131) of the first switch (13; 13d). The second filter (112) is connected to the third selection terminal (141) of the second switch (14; 14d). The third filter (121) is connected to the second selection terminal (132) of the first switch (13; 13d). The fourth filter (122) is connected to the fourth selection terminal (142) of the second switch (14; 14d). The antenna terminal (81) is connected to the first filter (111), the second filter (112), the third filter (121), and the fourth filter (122). The first switch (13; 13d) is capable of connecting the first selection terminal (131) or the second selection terminal (132) to the first common terminal (130) in a selective manner. The second switch (14; 14d) is capable of connecting the third selection terminal (141) or the fourth selection terminal (142) to the second common terminal (140) in a selective manner. The first switch (13; 13d), the second switch (14; 14d), and the control circuit (16) are provided in a single electronic component (201; 201d; 201e). The control circuit (16) is positioned between the first switch (13; 13d) and the second switch (14; 14d) in the electronic component (201; 201d; 201e).

According to this aspect, a reduction in the degree of isolation between the first switch (13; 13d) and the second switch (14; 14d) provided in the single electronic component (201; 201d; 201e) can be suppressed.

A radio frequency module (1; 1a to 1i) according to a second aspect is the radio frequency module according to the first aspect further including a plurality of ground terminals (161). The plurality of ground terminals (161) are provided in the electronic component (201; 201d). The plurality of ground terminals (161) are positioned at least between the first switch (13; 13d) and the control circuit (16) or between the second switch (14; 14d) and the control circuit (16) in a direction (for example, the first direction D21) in which the first switch (13; 13d), the second switch (14; 14d), and the control circuit (16) are arranged.

According to this aspect, due to the shielding effect of ground, a reduction in the degree of isolation between the first switch (13; 13*d*) and the second switch (14; 14*d*) can further be suppressed.

A radio frequency module (1; 1*a* to 1*i*) according to a third aspect is the radio frequency module according to the first or second aspect further including a mounting substrate (4). The mounting substrate (4) includes a first wiring pattern portion (441), a second wiring pattern portion (442), a third wiring pattern portion (443), and a fourth wiring pattern portion (444). The first wiring pattern portion (441) connects the first filter (111) and the first selection terminal (131) of the first switch (13; 13*d*) to each other. The second wiring pattern portion (442) connects the second filter (112) and the third selection terminal (141) of the second switch (14; 14*d*) to each other. The third wiring pattern portion (443) connects the third filter (121) and the second selection terminal (132) of the first switch (13; 13*d*) to each other. The fourth wiring pattern portion (444) connects the fourth filter (122) and the fourth selection terminal (142) of the second switch (14; 14*d*) to each other. In a plan view from a thickness direction (D1) of the mounting substrate (4), among the first wiring pattern portion (441), the second wiring pattern portion (442), the third wiring pattern portion (443), and the fourth wiring pattern portion (444), a plurality of wiring pattern portions through which a plurality of signals through simultaneous communication pass do not intersect each other, and one or more wiring pattern portions different from the plurality of wiring pattern portions among the first wiring pattern portion (441), the second wiring pattern portion (442), the third wiring pattern portion (443), and the fourth wiring pattern portion (444) do not intersect the plurality of wiring pattern portions.

According to this aspect, entry of a signal from one wiring pattern portion to another wiring pattern portion among the wiring pattern portions (441 to 444) can be suppressed.

A radio frequency module (1; 1*a* to 1*e*) according to a fourth aspect is the radio frequency module according to the third aspect in which the mounting substrate (4) has a main surface (41). The first filter (111) and the second filter (112) are provided in a second electronic component (202; 202*a*; 202*b*), which is a single electronic component different from a first electronic component (201; 201*d*; 201*e*), which is the electronic component (201; 201*d*; 201*e*). The third filter (121) and the fourth filter (122) are provided in a third electronic component (203; 203*a*), which is a single electronic component different from the first electronic component (201; 201*d*; 201*e*) and the second electronic component (202; 202*a*; 202*b*). The first electronic component (201; 201*d*; 201*e*), the second electronic component (202; 202*a*; 202*b*), and the third electronic component (203; 203*a*) are arranged on the main surface (41) of the mounting substrate (4). In a plan view from the thickness direction (D1) of the mounting substrate (4), the second electronic component (202; 202*a*; 202*b*) and the third electronic component (203; 203*a*) are arranged in a first direction (D21). In a plan view from the thickness direction (D1) of the mounting substrate (4), the second electronic component (202; 202*a*; 202*b*) and the first electronic component (203; 203*a*) are arranged in a second direction (D22), which intersects the first direction (D21), and the third electronic component (203; 203*a*) and the first electronic component (203; 203*a*) are arranged in the second direction (D22).

According to this aspect, signal loss due to a wiring length can be reduced.

A radio frequency module (1; 1*a* to 1*e*) according to a fifth aspect is the radio frequency module according to the fourth aspect further including a third switch (15; 15*d*). The third switch (15; 15*d*) is connected between the antenna terminal (81) and the first filter (111), second filter (112), third filter (121), and fourth filter (122). The third switch (15; 15*d*) is provided in a fourth electronic component (204; 204*d*), which is different from the first electronic component (201; 201*d*; 201*e*), the second electronic component (202; 202*a*; 202*b*), and the third electronic component (203; 203*a*). The fourth electronic component (204; 204*d*) is arranged on the main surface (41) of the mounting substrate (4). In a plan view from the thickness direction (D1) of the mounting substrate (4), the fourth electronic component (204; 204*d*) is positioned on an opposite side of the second electronic component (202; 202*a*; 202*b*) and the third electronic component (203; 203*a*) from a first electronic component (201; 201*d*; 201*e*) side.

According to this aspect, signal loss due to a wiring length can further be reduced.

A radio frequency module (1*b*) according to a sixth aspect is the radio frequency module according to the third aspect in which the first filter (111), the second filter (112), the third filter (121), and the fourth filter (122) are provided in a second electronic component (202*b*), which is a single electronic component different from a first electronic component (201), which is the electronic component (201).

According to this aspect, the size of the radio frequency module (1*b*) can be reduced.

A radio frequency module (1*f* to 1*h*) according to a seventh aspect is the radio frequency module according to the third aspect in which the mounting substrate (4) has a first main surface (41) and a second main surface (42), which face each other. The first filter (111) and the second filter (112) are provided in a second electronic component (202), which is a single electronic component different from a first electronic component (201), which is the electronic component (201). The third filter (121) and the fourth filter (122) are provided in a third electronic component (203), which is a single electronic component different from the first electronic component (201) and the second electronic component (202). The second electronic component (202) and the third electronic component (203) are arranged on the first main surface (41) of the mounting substrate (4). The first electronic component (201) is arranged on the second main surface (42) of the mounting substrate (4).

According to this aspect, entry of a signal from one wiring pattern portion to another wiring pattern portion among the wiring pattern portions (441 to 444) can be suppressed.

A radio frequency module (1; 1*a* to 1*i*) according to an eighth aspect is the radio frequency module according to any one of the fourth to seventh aspects in which the first filter (111) is a band pass filter. The third filter (121) is a band pass filter. A pass band of the first filter (111) and a pass band of third filter (121) overlap each other.

According to this aspect, it becomes possible to improve the degree of isolation between the first filter (111) and the third filter (121).

A radio frequency module (1; 1*a* to 1*i*) according to a ninth aspect is the radio frequency module according to any one of the fourth to eighth aspects in which the first filter (111) is a band pass filter. The second filter (112) is a band elimination filter. A pass band of the first filter (111) and a stopband of second filter (112) overlap each other.

A radio frequency module (1*g*) according to a tenth aspect is the radio frequency module according to the third aspect in which the mounting substrate (4) has a first main surface (41) and a second main surface (42), which face each other. The first filter (111) and the third filter (121) are provided in a second electronic component (202a), which is a single electronic component different from a first electronic component (201), which is the electronic component (201). The second filter (112) and the fourth filter (122) are provided in a third electronic component (203a), which is a single electronic component different from the first electronic component (201) and the second electronic component (202a). The second electronic component (202a) and the third electronic component (203a) are arranged on the first main surface (41) of the mounting substrate (4). The first electronic component (201) is arranged on the second main surface (42) of the mounting substrate (4).

According to this aspect, the wiring pattern portions (441 to 444) can be arranged such that the wiring pattern portions (441 to 444) do not intersect each other.

A radio frequency module (1g) according to an eleventh aspect is the radio frequency module according to the tenth aspect in which at least one of the second electronic component (202a) and the third electronic component (203a) overlaps the first electronic component (201) in a plan view from the thickness direction (D1) of the mounting substrate (4).

According to this aspect, signal loss due to a wiring length can be reduced.

A radio frequency module (1g) according to a twelfth aspect is the radio frequency module according to the tenth or eleventh aspect further including a third switch (15). The third switch (15) is connected between the antenna terminal (81) and the first filter (111), second filter (112), third filter (121), and fourth filter (122). The third switch (15) is provided in a fourth electronic component (204), which is different from the first electronic component (201), the second electronic component (202), and the third electronic component (203a). The fourth electronic component (204) is arranged on the second main surface (42) of the mounting substrate (4). At least one of the second electronic component (202a) and the third electronic component (203a) overlaps the fourth electronic component (204) in a plan view from the thickness direction (D1) of the mounting substrate (4).

According to this aspect, signal loss due to a wiring length can be reduced.

A radio frequency module (1i) according to a thirteenth aspect is the radio frequency module according to any one of the first to twelfth aspects in which at least one of the first filter (111), the second filter (112i), the third filter (121), and the fourth filter (122) is a hybrid filter. The hybrid filter includes an acoustic wave filter (110) including one or more acoustic wave resonators (124), an inductor (L5), and a capacitor (C5).

According to this aspect, a pass band width can be increased.

A communication device (100; 100c; 100d; 100e) according to a fourteenth aspect includes the radio frequency module (1; 1a to 1i) according to any one of the first to thirteenth aspects and a signal processing circuit (9). The signal processing circuit (9) is connected to the radio frequency module (1; 1a to 1i).

According to this aspect, a reduction in the degree of isolation between the first switch (13; 13d) and the second switch (14; 14d) provided in the single electronic component (201; 201d; 201e) can be suppressed.

What is claimed is:
1. A radio frequency module comprising:
a first switch, which has a first common terminal, a first selection terminal, and a second selection terminal;

a second switch, which has a second common terminal, a third selection terminal, and a fourth selection terminal;
a control circuit, which controls the first switch and the second switch;
a plurality of ground terminals:
a first filter, which is connected to the first selection terminal of the first switch;
a second filter, which is connected to the third selection terminal of the second switch;
a third filter, which is connected to the second selection terminal of the first switch;
a fourth filter, which is connected to the fourth selection terminal of the second switch; and
an antenna terminal, which is connected to the first filter, the second filter, the third filter, and the fourth filter, wherein
the first switch is capable of connecting the first selection terminal or the second selection terminal to the first common terminal in a selective manner,
the second switch is capable of connecting the third selection terminal or the fourth selection terminal to the second common terminal in a selective manner,
the first switch, the second switch, the plurality of ground terminals, and the control circuit are provided in a single electronic component as an integrated circuit (IC) chip,
the control circuit is positioned between the first switch and the second switch in the electronic component; and
the plurality of ground terminals are positioned at least between the first switch and the control circuit or between the second switch and the control circuit in a direction in which the first switch, the second switch, and the control circuit are arranged.
2. The radio frequency module according to claim 1, further comprising:
a mounting substrate, wherein the mounting substrate includes a first wiring pattern portion, which connects the first filter and the first selection terminal of the first switch to each other, a second wiring pattern portion, which connects the second filter and the third selection terminal of the second switch to each other, a third wiring pattern portion, which connects the third filter and the second selection terminal of the first switch to each other, and
a fourth wiring pattern portion, which connects the fourth filter and the fourth selection terminal of the second switch to each other, and
in a plan view from a thickness direction of the mounting substrate, among the first wiring pattern portion, the second wiring pattern portion, the third wiring pattern portion, and the fourth wiring pattern portion, a plurality of wiring pattern portions through which a plurality of signals through simultaneous communication pass do not intersect each other, and one or more wiring pattern portions different from the plurality of wiring pattern portions among the first wiring pattern portion, the second wiring pattern portion, the third wiring pattern portion, and the fourth wiring pattern portion do not intersect the plurality of wiring pattern portions.
3. The radio frequency module according to claim 2, wherein the mounting substrate has a main surface, the first filter and the second filter are provided in a second electronic component, which is a single electronic component different from a first electronic component, which is the electronic component, the third filter and the fourth filter are provided in a third electronic component, which is a single electronic component different from the first electronic component and the second electronic component, the first electronic component, the second electronic component, and the third electronic component are arranged on the main surface of the mounting substrate, in a plan view from the thickness direction of the mounting substrate, the second electronic component and the third electronic component are arranged in a first direction, and in a plan view from the thickness direction of the mounting substrate, the second electronic component and the first electronic component are arranged in a second direction, which intersects the first direction, and the third electronic component and the first electronic component are arranged in the second direction.

4. The radio frequency module according to claim 3, further comprising:

a third switch, which is connected between the antenna terminal and the first, second, third, and fourth filters, wherein the third switch is provided in a fourth electronic component, which is different from the first electronic component, the second electronic component, and the third electronic component, the fourth electronic component is arranged on the main surface of the mounting substrate, and in a plan view from the thickness direction of the mounting substrate, the fourth electronic component is positioned on an opposite side of the second electronic component and the third electronic component from a first electronic component side.

5. The radio frequency module according to claim 2, wherein the first filter, the second filter, the third filter, and the fourth filter are provided in a second electronic component, which is a single electronic component different from a first electronic component, which is the electronic component.

6. The radio frequency module according to claim 2, wherein the mounting substrate has a first main surface and a second main surface, which face each other, the first filter and the second filter are provided in a second electronic component, which is a single electronic component different from a first electronic component, which is the electronic component, the third filter and the fourth filter are provided in a third electronic component, which is a single electronic component different from the first electronic component and the second electronic component, the second electronic component and the third electronic component are arranged on the first main surface of the mounting substrate, and the first electronic component is arranged on the second main surface of the mounting substrate.

7. The radio frequency module according to claim 3, wherein the first filter is a band pass filter, the third filter is a band pass filter, and a pass band of the first filter and a pass band of the third filter overlap each other.

8. The radio frequency module according to claim 3, wherein the first filter is a band pass filter, the second filter is a band elimination filter, and a pass band of the first filter and a stopband of the second filter overlap each other.

9. The radio frequency module according to claim 2, wherein the mounting substrate has a first main surface and a second main surface, which face each other, the first filter and the third filter are provided in a second electronic component, which is a single electronic component different from a first electronic component, which is the electronic component, the second filter and the fourth filter are provided in a third electronic component, which is a single electronic component different from the first electronic component and the second electronic component, the second electronic component and the third electronic component are arranged on the first main surface of the mounting substrate, and the first electronic component is arranged on the second main surface of the mounting substrate.

10. The radio frequency module according to claim 9, wherein at least one of the second electronic component and the third electronic component overlaps the first electronic component in a plan view from the thickness direction of the mounting substrate.

11. The radio frequency module according to claim 9, further comprising:

a third switch, which is connected between the antenna terminal and the first, second, third, and fourth filters, wherein the third switch is provided in a fourth electronic component, which is different from the first electronic component, the second electronic component, and the third electronic component, the fourth electronic component is arranged on the second main surface of the mounting substrate, and at least one of the second electronic component and the third electronic component overlaps the fourth electronic component in a plan view from the thickness direction of the mounting substrate.

12. The radio frequency module according to claim 1, further comprising:

a hybrid filter including at least one filter out of the first filter, the second filter, the third filter, and the fourth filter, wherein the at least one filter is an acoustic wave filter including one or more acoustic wave resonators, and the hybrid filter further includes an inductor and a capacitor.

13. A communication device comprising:

the radio frequency module according to claim 1; and a signal processing circuit connected to the radio frequency module.

14. The radio frequency module according to claim 4, wherein the first filter is a band pass filter, the third filter is a band pass filter, and a pass band of the first filter and a pass band of the third filter overlap each other.

15. The radio frequency module according to claim 4, wherein the first filter is a band pass filter, the second filter is a band elimination filter, and a pass band of the first filter and a stopband of the second filter overlap each other.

16. The radio frequency module according to claim 5, wherein the first filter is a band pass filter, the third filter is a band pass filter, and a pass band of the first filter and a pass band of the third filter overlap each other.

17. The radio frequency module according to claim 5, wherein the first filter is a band pass filter, the second filter is a band elimination filter, and a pass band of the first filter and a stopband of the second filter overlap each other.

18. The radio frequency module according to claim 6, wherein the first filter is a band pass filter, the third filter is a band pass filter, and a pass band of the first filter and a pass band of the third filter overlap each other.

19. The radio frequency module according to claim 6, wherein the first filter is a band pass filter, the second filter is a band elimination filter, and a pass band of the first filter and a stopband of the second filter overlap each other.

20. The radio frequency module according to claim 1, further comprising:

a resin layer covering the single electronic component; and a metal electrode layer covering a surface of the resin layer, wherein the metal electrode layer is connected to a ground potential.

* * * * *